US012787490B2

(12) United States Patent
Lee et al.

(10) Patent No.: US 12,787,490 B2
(45) Date of Patent: Nov. 3, 2026

(54) INSPECTION DEVICE AND METHOD OF INSPECTING AND REPAIRING DISPLAY PANEL BY USING THE SAME

(71) Applicant: SAMSUNG DISPLAY CO., LTD., Yongin-si (KR)

(72) Inventors: Won Ho Lee, Yongin-si (KR); Hyun Deok Im, Yongin-si (KR); Hyun Min Cho, Yongin-si (KR); Jong Hyuk Kang, Yongin-si (KR); Sung-Chan Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1074 days.

(21) Appl. No.: 17/801,428

(22) PCT Filed: Apr. 10, 2020

(86) PCT No.: PCT/KR2020/004942
§ 371 (c)(1),
(2) Date: Aug. 22, 2022

(87) PCT Pub. No.: WO2021/172652
PCT Pub. Date: Sep. 2, 2021

(65) Prior Publication Data
US 2023/0078237 A1 Mar. 16, 2023

(30) Foreign Application Priority Data
Feb. 24, 2020 (KR) ........................ 10-2020-0022571

(51) Int. Cl.
*H10H 20/01* (2025.01)
*G06T 7/00* (2017.01)
(Continued)

(52) U.S. Cl.
CPC ............. *H10H 20/01* (2025.01); *G06T 7/001* (2013.01); *H10H 20/812* (2025.01);
(Continued)

(58) Field of Classification Search
CPC ...... H10H 20/01; H10H 20/821; H10H 20/84; H10H 20/812; H10H 29/142; G06T 7/001;
(Continued)

(56) References Cited

U.S. PATENT DOCUMENTS 7,858,963 B2 12/2010 Ueno et al.
8,013,821 B2 9/2011 Park
(Continued)

FOREIGN PATENT DOCUMENTS

CN 1749811 A 3/2006
CN 101135794 A 3/2008
(Continued)

OTHER PUBLICATIONS

International Search Report, with English translation, corresponding to International Application No. PCT/KR2020/004942 dated Nov. 11, 2020.
(Continued)

*Primary Examiner* — Yassin Alata
(74) *Attorney, Agent, or Firm* — Womble Bond Dickinson (US) LLP

(57) ABSTRACT

An inspection device, and a method of inspecting and a method of repairing a display panel using the inspection device are provided. The method of inspecting the display panel including light emitting elements includes acquiring an image of the display panel, and determining an alignment degree of the light emitting elements in the display panel.

7 Claims, 31 Drawing Sheets

(51) Int. Cl.

| | |
|---|---|
| ***H10H 20/812*** | (2025.01) |
| ***H10H 20/821*** | (2025.01) |
| ***H10H 20/84*** | (2025.01) |
| ***H10H 29/14*** | (2025.01) |
| ***H10P 72/00*** | (2026.01) |

(52) U.S. Cl.

CPC .......... *H10H 20/821* (2025.01); *H10H 20/84* (2025.01); *H10H 29/142* (2025.01); *H10P 72/0616* (2026.01); *G06T 2207/10048* (2013.01); *G06T 2207/10064* (2013.01); *G06T 2207/30121* (2013.01)

(58) Field of Classification Search

CPC . G06T 2207/10048; G06T 2207/10064; G06T 2207/30121; H01L 21/67288

See application file for complete search history.

(56) References Cited

U.S. PATENT DOCUMENTS

| | | | | |
|---|---|---|---|---|
| 10,713,985 | B2 | 7/2020 | Ju | |
| 2006/0057478 | A1 | 3/2006 | Kwon et al. | |
| 2006/0202213 | A1* | 9/2006 | Oohata | H01L 24/24 257/81 |
| 2012/0196388 | A1 | 8/2012 | Tanaka | |
| 2016/0161294 | A1 | 6/2016 | Ip et al. | |
| 2017/0140961 | A1* | 5/2017 | Sasaki | H01L 25/50 |
| 2018/0033399 | A1 | 2/2018 | Kawashima et al. | |
| 2019/0180661 | A1* | 6/2019 | Ju | G01N 21/956 |
| 2020/0200817 | A1* | 6/2020 | Lin | G01R 31/01 |
| 2021/0288220 | A1 | 9/2021 | Oh et al. | |

FOREIGN PATENT DOCUMENTS

| | | |
|---|---|---|
| CN | 101874309 A | 10/2010 |
| JP | 2007-318031 | 12/2007 |
| KR | 10-1730075 | 4/2017 |
| KR | 10-2019-0069664 | 6/2019 |
| KR | 10-2019-0085892 | 7/2019 |
| KR | 10-2019-0088930 | 7/2019 |
| KR | 10-2019-0102382 | 9/2019 |
| KR | 10-2038354 | 10/2019 |
| KR | 10-2020-0010701 | 1/2020 |
| KR | 10-2021-0016122 | 2/2021 |
| WO | 2014/149864 | 9/2014 |

OTHER PUBLICATIONS

Written Opinion, with English translation, corresponding to International Application No. PCT/KR2020/004942, dated Nov. 11, 2020.

* cited by examiner

INSPECTION DEVICE AND METHOD OF INSPECTING AND REPAIRING DISPLAY PANEL BY USING THE SAME

CROSS-REFERENCE TO RELATED APPLICATION(S)

This application is a national entry of International Application No. PCT/KR2020/004942, filed on Apr. 10, 2020, which claims under 35 U.S.C. §§ 119(a) and 365(b) priority to and benefits of Korean Patent Application No. 10-2020-0022571, filed on Feb. 24, 2020, in the Korean Intellectual Property Office (KIPO), the entire contents of which are incorporated herein by reference.

BACKGROUND

1. Technical Field

Embodiments of the disclosure relate to an inspection device, and a method of inspecting and a method of repairing a display panel by using the inspection device.

2. Description of the Related Art

Importance of a display device has been increasing with development of multimedia. As a result, various types of display devices such as an organic light emitting display (OLED) and a liquid crystal display (LCD) are being used in various technical fields.

Various display panels for displaying an image of a display device, e.g., an organic light emitting display panel or a liquid crystal display panel, have been developed. For example, the display panels may include a light emitting element such as a light emitting diode (LED). For example, the light emitting diode (LED) may include organic light emitting diode (OLED) using an organic material as a fluorescent material, an inorganic light emitting diode using an inorganic material as a fluorescent material, and the like.

The inorganic light emitting diode using the inorganic semiconductor as a fluorescent material may have an advantage in that the inorganic light emitting diode has durability even in a high temperature environment and efficiency of blue light is higher than that of an organic light emitting diode. In addition, also in a manufacturing process pointed out as a limitation of the existing inorganic light emitting diode element, a transfer method using a dielectrophoresis (DEP) method has been developed. Accordingly, study on an inorganic light emitting diode having superior durability and efficiency compared to an organic light emitting diode is continuing.

As the above-described display device has been studied, an inspection device for inspecting a defect of the display device is being studied together.

SUMMARY

Embodiments of the disclosure are capable of inspecting and repairing a display device such that an alignment degree of a light emitting element in the display device may be improved and enhanced.

Further, embodiments of the disclosure are capable of inspecting and repairing a display device such that density of a light emitting element in the display device may be improved and enhanced.

Furthermore, embodiments of the disclosure are capable of inspecting and repairing a display device such that an alignment degree of a light emitting element in the display device and density of the light emitting element together may be improved and enhanced.

The objects of the disclosure are not limited to the object described above, and other technical objects which are not described will be clearly understood by those skilled in the art from the following description.

According to an embodiment for solving the above-described object, a method of inspecting a display panel including light emitting elements may include acquiring an image of the display panel, and determining an alignment degree of the light emitting elements in the display panel.

The method of inspecting the display panel may further include forming an electric field in the display panel, and irradiating light generated from a first light source included in a first light emitting unit to an inspection area of the display panel.

The light emitting elements may be provided to the display panel by an inkjet method of injecting ink including the light emitting elements at a first concentration, and the forming of the electric field and irradiating of the light may be performed in a state in which the ink injected on the display panel is not dried.

The light generated from the first light source may be ultraviolet ray.

The first light emitter may include the first light source and a second light source that generates infrared ray.

The acquiring of the image may be performed after the forming the electric field and the irradiating of the light.

The acquiring of the image may be performed by collecting fluorescence and excitation light emitted by the light emitting elements and imaging collected information.

According to another embodiment for solving the above-described object, a method of repairing a display panel may include forming an electric field in a display panel having light emitting elements, irradiating light generated from a light source included in a first light emitter to an inspection area of the display panel, acquiring an image of the display panel, and rearranging the light emitting elements.

The rearranging the light emitting elements may include irradiating light generated from a third light source included in a second light emitter to a repair area the display panel in a state in which the electric field is formed in the display panel.

The light generated from the third light source may be ultraviolet ray.

The method of repairing the display panel may further include determining an alignment degree of the light emitting elements in the display panel through the image.

The determining of the alignment degree of the light emitting elements may be performed according to a result of comparing the alignment degree with a reference value in the determining of the alignment degree of the light emitting elements.

The determining of the alignment degree of the light emitting elements may be performed again after the rearranging of the light emitting elements.

The method of repairing the display panel may further include the determining a density of the light emitting elements in the display panel through the image.

The method of repairing the display panel may further include the additionally providing the light emitting elements on the display panel according to a result of comparing the density of the light emitting elements with a reference value in the determining of the density of the light emitting elements.

The method of repairing the display panel may further include the storing position information on a corresponding area according to the result of comparing the density of the light emitting elements with the reference value in the determining the density of the light emitting elements, and drying an ink including the light emitting elements at a first concentration which is input when the display panel is formed.

The additionally providing of the light emitting elements on the display panel may include the injecting ink including the additionally provided light emitting elements at a second concentration lower than the first concentration, to the display panel.

According to still another embodiment for solving the above-described object, an inspection device for inspecting and repairing a display panel including light emitting elements may include a panel loader that receives the display panel, a measurement part that inspects the display panel, a repairer that repairs the display panel, a position adjuster that moves the panel loader, the measurement part, and the repairer, and a controller that controls the panel loader, the measurement part, the repairer, and the position adjuster.

The measurement part may include a first light emitter including a first light source that generates light in a range of ultraviolet ray to visible light, and a light receiver that collects fluorescence and excitation light emitted by the light emitting elements irradiated with light generated from the first light source.

The measurement part may further include a first filter through which the light generated from the first light source passes, and a second filter through which the fluorescence and the excitation light pass.

The first light emitter may further include a second light source that generates infrared ray.

The repairer may include a second light emitting unit including a third light source that generates light in a range of ultraviolet ray to visible light.

The repairer may further include an inkjet facility unit that provides an ink including a light emitting element to the display panel.

Each light emitting element may include a first semiconductor layer including an n-type semiconductor material, a second semiconductor layer including a p-type semiconductor material, and an active layer interposed between the first semiconductor layer and the second semiconductor layer and formed in a quantum well structure.

A length of the first semiconductor layer may be longer than a length of the second semiconductor layer, and a light amount of fluorescence and excitation light emitted from the active layer may be greater than a light amount of each fluorescence and excitation light generated in the first semiconductor layer and the second semiconductor layer.

The panel loader may include a panel mover that moves the display panel, and an electric field generator that forms an electric field in the display panel.

According to embodiments of the disclosure, an alignment degree and/or density of a light emitting element in a display device may be increased.

An effect according to embodiments is not limited by the contents described as an example above, and more various effects are included in the descriptions.

DETAILED DESCRIPTION OF THE EMBODIMENTS

Figure 1:
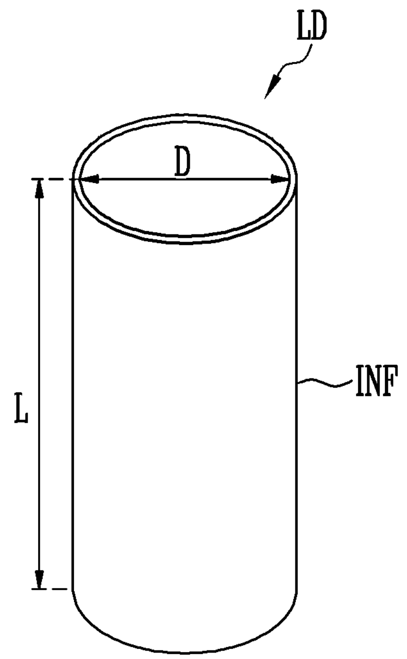
FIGS. 1 and 2 are schematic perspective and cross-sectional views illustrating a light emitting element according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the . . . term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in detail with reference to the accompanying drawings. The same or similar reference numerals are used for the same configuration in the drawings.

Figure 2:
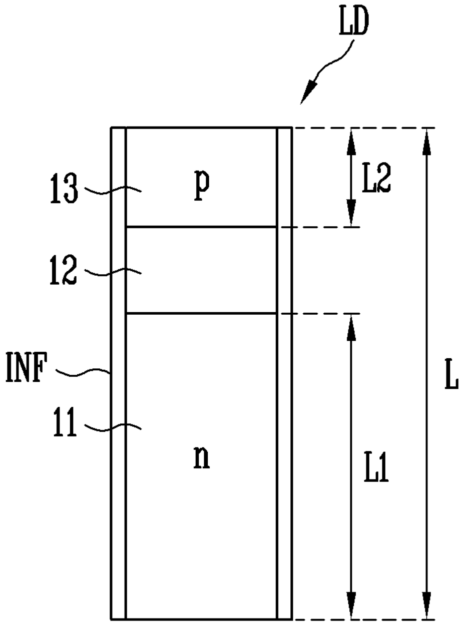

FIGS. 1 and 2 are schematic perspective and schematic cross-sectional views illustrating a light emitting element according to an embodiment. Although a rod shape light emitting element LD of a cylindrical shape is shown in FIGS. 1 and 2, a type and/or a shape of the light emitting element LD according to the embodiment is not limited thereto.

Referring to FIGS. 1 and 2, the light emitting element LD may include a first semiconductor layer 11 and a second semiconductor layer 13, and an active layer 12 interposed between the first and second semiconductor layers 11 and 13. For example, the light emitting element LD may be formed as a stack in which the first semiconductor layer 11, the active layer 12, and the second semiconductor layer 13 are sequentially stacked along one direction.

For example, the light emitting element LD may be provided in a rod shape extending along one direction. The light emitting element LD may have one side end and another side end along the one direction.

For example, one of the first and second semiconductor layers 11 and 13 may be disposed at the one side end of the light emitting element LD, and the other of the first and second semiconductor layers 11 and 13 may be disposed at the other side end of the light emitting element LD.

For example, the light emitting element LD may be a rod shape light emitting diode, which has a rod shape. For example, the rod shape may include a rod-like shape or a bar-like shape that is longer in a longitudinal direction than a width direction (e.g., having aspect ratio greater than 1), such as a cylinder or polygonal column, and the shape of a cross-section thereof is not particularly limited. For example, a length L of the light emitting element LD may be greater than a diameter D (e.g., a width of the cross-section) thereof.

For example, the light emitting element LD may have a size as small as a nano scale to a micro scale (e.g., nanometer scale to micrometer scale), for example, the diameter D and/or the length L of a range of about 100 nm to about 10 μm. However, the size of the light emitting element LD is not limited thereto. For example, the size of the light emitting element LD may be variously changed or modified according to a design condition of various devices using the light emitting element LD as a light source, for example, a display device or the like.

The first semiconductor layer 11 may include at least one n-type semiconductor material. For example, the first semiconductor layer 11 may include one semiconductor material among InAlGaN, GaN, AlGaN, InGaN, AlN, and InN, and may include an n-type semiconductor material doped with a first conductive dopant such as Si, Ge, or Sn. However, the material of the first semiconductor layer 11 is not limited thereto, and various materials other than the material described above may also be used to form the first semiconductor layer 11.

The active layer 12 may be disposed on the first semiconductor layer 11 and may be formed in a single or multiple quantum well structure. In an embodiment, a clad layer doped with a conductive dopant may be formed on and/or under of the active layer 12. For example, the clad layer may be formed of an AlGaN layer or an InAlGaN layer. According to an embodiment, a material of AlGaN, AlInGaN, or the like may be used to form the active layer 12, and various materials other than the material described above may be used to form the active layer 12. In other words, the active layer 12 may be disposed between the first semiconductor layer 11 and the second semiconductor layer 13 which will be described later.

When a voltage greater than or equal to a threshold voltage is applied to both ends of the light emitting element LD, the light emitting element LD may emit light when electron-hole pairs are combined in the active layer 12. By controlling light emission of the light emitting element LD using this principle, the light emitting element LD may be used as a light source of various light emitting devices including pixels of a display device.

The second semiconductor layer 13 may be disposed on the active layer 12 and may include a semiconductor material of a type different from that of the first semiconductor layer 11. For example, the second semiconductor layer 13 may include at least one p-type semiconductor material. For example, the second semiconductor layer 13 may include at least one semiconductor material among InAlGaN, GaN, AlGaN, InGaN, AlN, and InN, and may include a p-type semiconductor material doped with a second conductive dopant such as Mg. However, the material of the second semiconductor layer 13 is not limited thereto, and various materials other than the material described above may be used to form the second semiconductor layer 13.

According to an embodiment, a first length L1 of the first semiconductor layer 11 may be longer than a second length L2 of the second semiconductor layer 13.

For example, the light emitting element LD may further include an insulating film INF provided on a surface. The insulating film INF may be formed on the surface of the light emitting element LD to surround at least an outer circumferential surface of the active layer 12, and may further surround one area of the first and second semiconductor layers 11 and 13.

However, according to an embodiment, the insulating film INF may expose the both ends of the light emitting element LD having different polarities. For example, the insulating film INF may not cover and may expose one ends of each of the first and second semiconductor layers 11 and 13 positioned at the both ends of the light emitting element LD on the longitudinal direction, for example, two planes (e.g., an upper surface and a lower surface) of a cylinder. In some other embodiments, the insulating film INF may expose the both ends of the light emitting element LD having different polarities and sides of the first and second semiconductor layers 11 and 13 adjacent to the both ends.

According to an embodiment, the insulating film INF may include at least one insulating material among silicon dioxide ($SiO_2$), silicon nitride ($Si_3N_4$), aluminum oxide ($Al_2O_3$), and titanium dioxide ($TiO_2$), but embodiments are not limited thereto. For example, a material of the insulating film INF is not particularly limited thereto, and the insulating film INF may be formed of various currently known insulating materials.

In an embodiment, the light emitting element LD may further include an additional component in addition to the first semiconductor layer 11, the active layer 12, the second semiconductor layer 13, and/or the insulating film INF. For example, the light emitting element LD may additionally include one or more phosphor layers, active layers, semiconductor materials and/or electrode layers disposed on one end side of the first semiconductor layer 11, the active layer 12, and/or the second semiconductor layer 13.

When a voltage greater than or equal to a threshold voltage is applied to both ends of the light emitting element LD, the light emitting element LD may emit light when electron-hole pairs are combined in the active layer 12. By controlling light emission of the light emitting element LD using this principle, the light emitting element LD may be used as a light source of various light emitting devices including a pixel of a display device.

Figure 3:
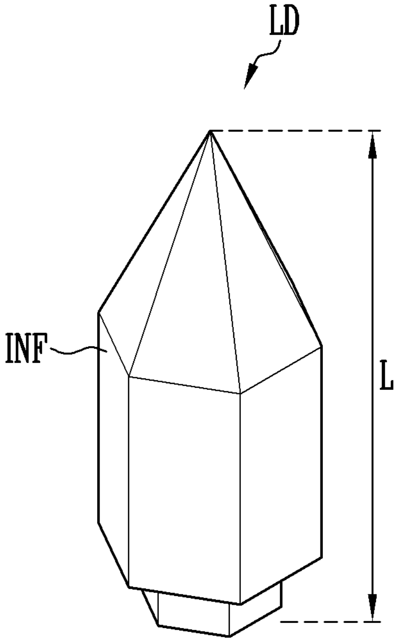
FIGS. 3 and 4 are schematic perspective and schematic cross-sectional views illustrating a light emitting element according to another embodiment.
Figure 4:
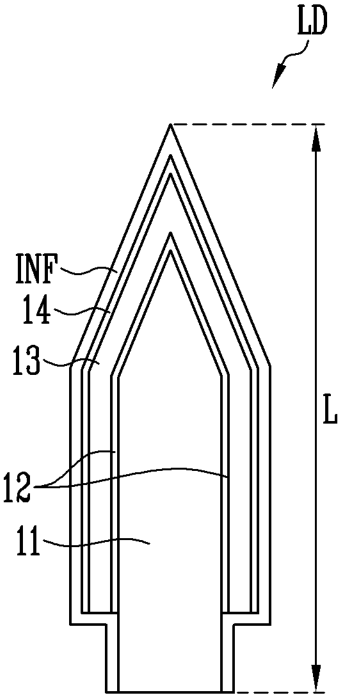

FIGS. 3 and 4 are schematic perspective and schematic cross-sectional views illustrating a light emitting element according to another embodiment.

Referring to FIGS. 3 and 4, the light emitting element LD according to an embodiment may include a first semiconductor layer 11 and a second semiconductor layer 13, and an active layer 12 interposed between the first and second semiconductor layers 11 and 13. For example, the first semiconductor layer 11 may be disposed in a center area of the light emitting element LD, and the active layer 12 may be disposed on a surface of the first semiconductor layer 11 to surround at least one area of the first semiconductor layer 11. For example, the second semiconductor layer 13 may be disposed on a surface of the active layer 12 to surround at least one area of the active layer 12.

For example, the light emitting element LD may further include an electrode layer 14 and/or an insulating film INF surrounding at least one area of the second semiconductor layer 13. For example, the light emitting element LD may include the electrode layer 14 disposed on a surface of the second semiconductor layer 13 to surround one area of the second semiconductor layer 13, and the insulating film INF disposed on a surface of the electrode layer 14 to surround at least one area of the electrode layer 14. For example, the light emitting element LD according to the embodiment may be implemented as a core-shell structure including the first semiconductor layer 11, the active layer 12, the second semiconductor layer 13, the electrode layer 14, and the insulating film INF sequentially disposed in an outer direction from a center. In another embodiment, the electrode layer 14 and/or the insulating film INF may be omitted.

In an embodiment, the light emitting element LD may be provided in a polygonal horn shape extending along any one direction. For example, at least one area of the light emitting element LD may have a hexagonal horn shape. However, a shape of the light emitting element LD is not limited thereto, and may be variously changed.

When an extension direction of the light emitting element LD is referred to as a length L direction, the light emitting element LD may have one side end and another side end along the length L direction. According to an embodiment, one of the first and second semiconductor layers 11 and 13 may be disposed at the one side end of the light emitting element LD, and the other of the first and second semiconductor layers 11 and 13 may be disposed at the other side end of the light emitting element LD.

In an embodiment, the light emitting element LD may be an ultra-small light emitting diode of a core-shell structure formed in a polygonal column shape, for example, a hexagonal horn shape of which both ends are protruded. For example, the light emitting element LD may have a size as small as a nano scale to a micro scale, for example, a width and/or a length L of a range of a nano scale or a micro scale, respectively. However, a size, a shape, and/or the like of the light emitting element LD may be variously changed according to a design condition of various devices using the light emitting element as a light source, for example, a display device or the like.

In an embodiment, both ends of the first semiconductor layer 11 may have a protruding shape along the length L direction of the light emitting element LD. Shapes of the both ends of the first semiconductor layer 11 may be different from each other. For example, one end disposed on an upper side of the both ends of the first semiconductor layer 11 may have a horn shape contacting one vertex as a width narrows toward an upper portion. For example, another end of the first semiconductor layer 11 disposed on a lower side of the both ends of the first semiconductor layer 11 may have a polygonal column shape having a substantially constant width, but embodiments are not limited thereto. For example, in another embodiment, the first semiconductor layer 11 may have a cross-section of a polygonal shape, a step shape, or the like in which the width is gradually narrowed as moving toward a lower portion. The shape of the both ends of the first semiconductor layer 11 may be variously changed according to an embodiment, and is not limited to the above-described embodiment.

According to an embodiment, the first semiconductor layer 11 may be positioned at a core, that is, a center (or a center area) of the light emitting element LD. For example, the light emitting element LD may be provided in a shape corresponding to the shape of the first semiconductor layer 11. For example, when the first semiconductor layer 11 has a hexagonal horn shape, the light emitting element LD may have a hexagonal horn shape.

Figure 5:
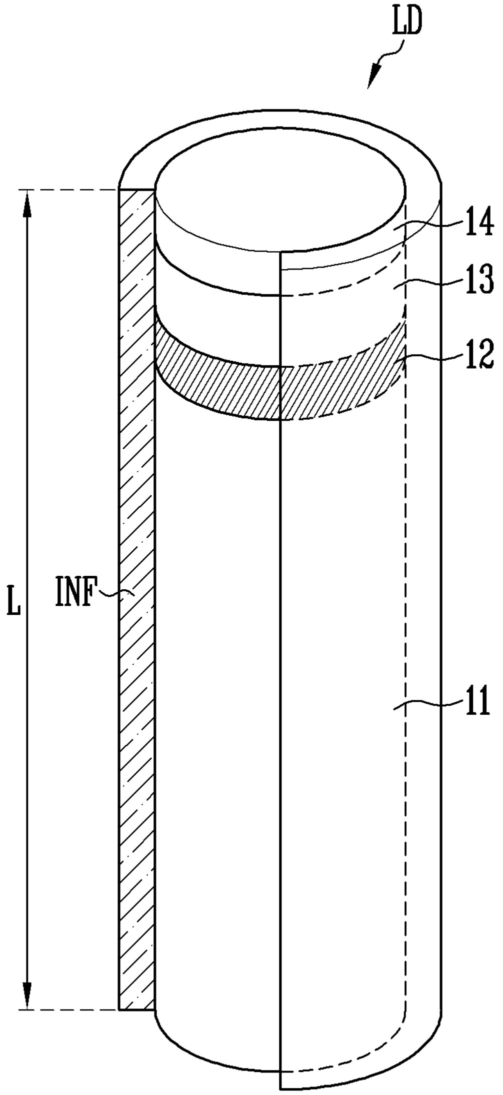
FIG. 5 is a schematic perspective view illustrating a light emitting element according to still another embodiment.

FIG. 5 is a schematic perspective view illustrating a light emitting element according to still another embodiment. In FIG. 5, a portion of the insulating film INF is omitted for convenience of description.

Referring to FIG. 5, the light emitting element LD may further include an electrode layer 14 disposed on the second semiconductor layer 13.

The electrode layer 14 may be an ohmic contact electrode electrically connected to the second semiconductor layer 13, but embodiments are not limited thereto. According to an embodiment, the electrode layer 14 may be a Schottky contact electrode. The electrode layer 14 may include a metal or a metal oxide, and for example, Cr, Ti, Al, Au, Ni, ITO, IZO, ITZO, and an oxide or an alloy thereof may be used alone or in combination. For example, the electrode layer 14 may be substantially transparent or translucent. Therefore, light generated in the active layer 12 of the light emitting element LD may pass through the electrode layer 14 and may be emitted to the outside of the light emitting element LD.

In another embodiment, the light emitting element LD may include the electrode layer 14 disposed on the second semiconductor layer 13, and may further include an electrode layer disposed on the first semiconductor layer 11.

Figure 6:
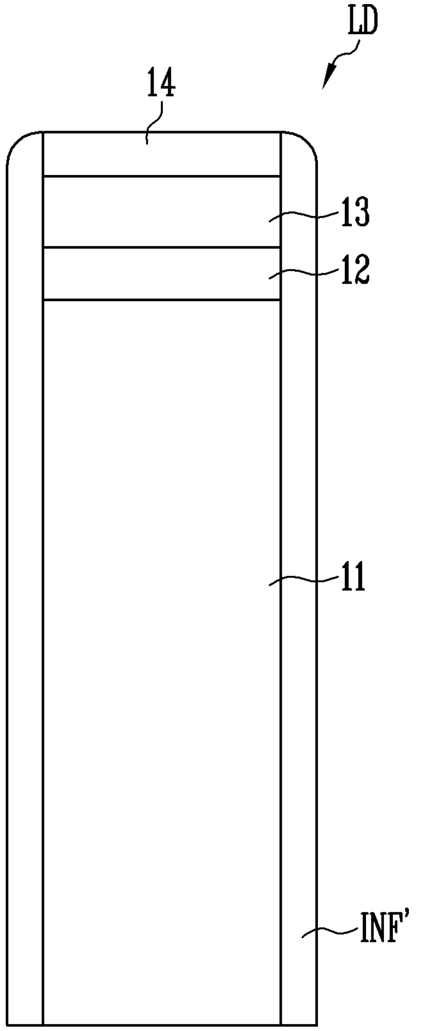
FIG. 6 is a schematic cross-sectional view illustrating a light emitting element according to still another embodiment.

FIG. 6 is a schematic cross-sectional view illustrating a light emitting element according to still another embodiment.

Referring to FIG. 6, an insulating film INF' may have a curved shape in a corner area adjacent to the electrode layer 14. According to an embodiment, the curved surface may be formed by etching when the light emitting element LD is formed.

For example, in the light emitting element of another embodiment having a structure further including an electrode layer disposed on the first semiconductor layer 11, the insulating film INF' may have a curved shape in an area adjacent to the electrode layer.

Figure 7:
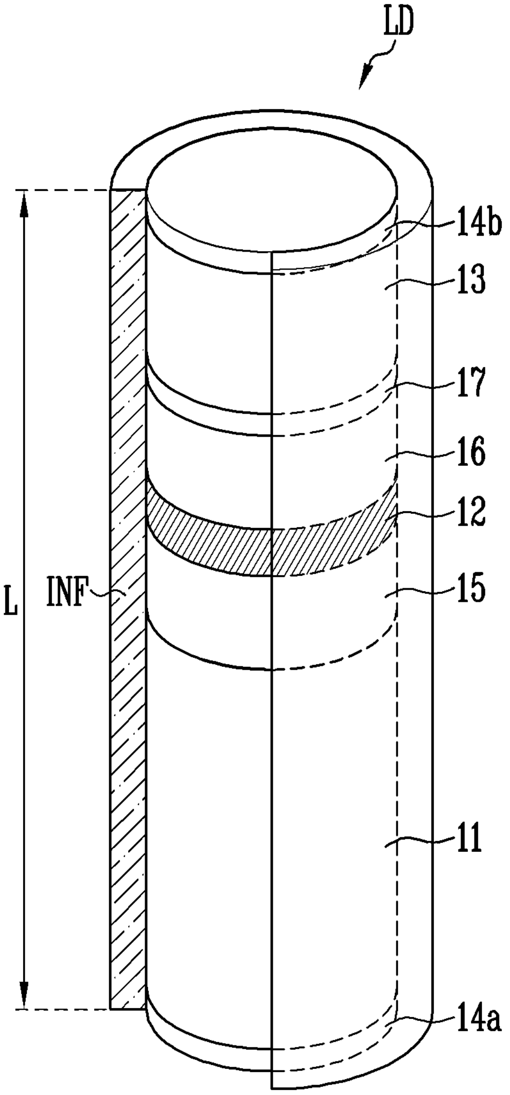
FIG. 7 is a schematic perspective view illustrating a light emitting element according to still another embodiment.

FIG. 7 is a schematic perspective view illustrating a light emitting element according to still another embodiment. In FIG. 7, a portion of the insulating film INF is omitted for convenience of description.

First, referring to FIG. 7, the light emitting element LD may further include a third semiconductor layer 15 disposed between the first semiconductor layer 11 and the active layer 12, and a fourth semiconductor layer 16 and a fifth semiconductor layer 17 disposed between the active layer 12 and the second semiconductor layers 13. The light emitting element LD of FIG. 7 is different from the embodiment of FIG. 1, in that the plurality of semiconductor layers 15, 16, and 17 and first and second electrode layers 14*a* and 14*b* are further disposed, and the active layer 12 includes another element. For example, a disposition and a structure of the insulating film INF are substantially the same as those of FIG. 1. In FIG. 7, some members are the same as those of FIG. 1, but new reference numerals are given for convenience of description. Hereinafter, a redundant description is omitted and a different point is mainly described to avoid redundancy.

For example, in the light emitting element LD of FIG. 1, the active layer 12 may emit blue or green light by including nitrogen (N). On the other hand, in the light emitting element LD of FIG. 7, each of the active layer 12 and the other semiconductor layers 11, 13, 15, 16 and 17 may be a semiconductor including at least phosphorus (P). For example, the light emitting element LD according to an embodiment may emit red light of which a center wavelength band has a range of about 620 nm to about 750 nm. However, the center wavelength band of the red light is not limited to the above-described range and includes all wavelength ranges that may be recognized as red in the present technical field.

For example, in the light emitting element LD according to the embodiment of FIG. 7, the first semiconductor layer 11 may be an n-type semiconductor layer, and when the light emitting element LD emits red light, the first semiconductor layer 11 may include a semiconductor material having a chemical formula of $In_xAl_yGa_{(1-x-y)}P$($0 \le x \le 1$, $0 \le y \le 1$, $0 \le x+y \le 1$). For example, the first semiconductor layer 11 may be any one or more of n-type doped InAlGaP, GaP, AlGaP, InGaP, AlP, and InP. The first semiconductor layer 11 may be doped with an n-type dopant, and for example, the n-type dopant may be Si, Ge, Sn, or the like. In an embodiment, the first semiconductor layer 11 may be n-AlGaInP doped with n-type Si. A length of the first semiconductor layer 11 may have a range of about 1.5 μm to about 5 μm, but embodiments are not limited thereto.

The second semiconductor layer 13 may be a p-type semiconductor layer, and when the light emitting element LD emits red light, the second semiconductor layer 13 may include a semiconductor material having a chemical formula of $In_xAl_yGa_{(i-x-y)}P$($0 \le x \le 1$, $0 \le y \le 01$, $0 \le x+y \le 1$). For example, the second semiconductor layer 13 may be any one or more of p-type doped InAlGaP, GaP, AlGaNP, InGaP, AlP, and InP. The second semiconductor layer 13 may be doped with a p-type dopant, and for example, the p-type dopant may be Mg, Zn, Ca, Se, Ba, or the like. In an embodiment, the second semiconductor layer 13 may be p-GaP doped with p-type Mg. A length of the second semiconductor layer 13 may have a range of about 0.08 μm to about 0.25 μm, but embodiments are not limited thereto.

The active layer 12 may be disposed between the first semiconductor layer 11 and the second semiconductor layer 13. Identically or similarly to the active layer 12 of FIG. 1, the active layer 12 of FIG. 7 may also emit light of a specific wavelength band by including a single or multiple quantum well structure material. For example, when the active layer 12 emits light of a red wavelength band, the active layer 12 may include a material of AlGaP, AlInGaP, or the like. In particular, when the active layer 12 has a structure in which a quantum layer and a well layer are alternately stacked in a multiple quantum well structure, the quantum layer may include a material such as AlGaP or AlInGaP, and the well layer may include a material such as GaP or AlInP. In an embodiment, the active layer 12 may emit red light having a center wavelength band of about 620 nm to about 750 nm by including AlGaInP as the quantum layer and AlInP as the well layer.

The light emitting element LD of FIG. 7 may include a clad layer disposed adjacent to the active layer 12. As shown in the drawing, the third semiconductor layer 15 and the fourth semiconductor layer 16 disposed between the first semiconductor layer 11 and the second semiconductor layer 13 over and under the active layer 12 may be clad layers.

The third semiconductor layer 15 may be disposed between the first semiconductor layer 11 and the active layer 12. The third semiconductor layer 15 may be an n-type semiconductor identically or similarly to the first semiconductor layer 11, and for example, the third semiconductor layer 15 may include a semiconductor material having a chemical formula of $In_xAl_yGa_{(1-x-y)}P$($0 \le x \le 1$, $0 \le y \le 1$, $0 \le x+y \le 1$). In an embodiment, the first semiconductor layer 11 may be n-AlGaInP, and the third semiconductor layer 15 may be n-AlInP. However, embodiments are not limited thereto.

The fourth semiconductor layer 16 may be disposed between the active layer 12 and the second semiconductor layer 13. The fourth semiconductor layer 16 may be an n-type semiconductor identically or similarly to the second semiconductor layer 13, and for example, the fourth semiconductor layer 16 may include a semiconductor material having a chemical formula of $In_xAl_yGa_{(1-x-y)}P$($0 \le x \le 1$, $0 \le y \le 1$, $0 \le x+y \le 1$). In an embodiment, the second semiconductor layer 13 may be p-GaP, and the fourth semiconductor layer 16 may be p-AlInP.

The fifth semiconductor layer 17 may be disposed between the fourth semiconductor layer 16 and the second semiconductor layer 13. The fifth semiconductor layer 17 may be a p-doped semiconductor identically or similarly to the second semiconductor layer 13 and the fourth semiconductor layer 16. In some embodiments, the fifth semiconductor layer 17 may perform a function of reducing a lattice constant difference between the fourth semiconductor layer 16 and the second semiconductor layer 13. For example, the fifth semiconductor layer 17 may be a tensile strain barrier reducing (TSBR) layer. For example, the fifth semiconductor layer 17 may include p-GaInP, p-AlInP, p-AlGaInP, and the like, but embodiments are not limited thereto. For example, a length of the third semiconductor layer 15, the fourth semiconductor layer 16, and the fifth semiconductor layer 17 may have a range of about 0.08 μm to about 0.25 μm, but embodiments are not limited thereto.

The first electrode layer **14*a* and the second electrode layer 14*b* may be disposed on the first semiconductor layer 11 and the second semiconductor layer 13, respectively. The first electrode layer 14*a* may be disposed on a lower surface of the first semiconductor layer 11, and the second electrode layer 14*b* may be disposed on an upper surface of the second semiconductor layer 13. However, embodiments are not limited thereto, at least one of the first electrode layer 14*a* and the second electrode layer 14*b* may be omitted. For example, in the light emitting element LD, the first electrode layer 14*a* may not be disposed on the lower surface of the first semiconductor layer 11, and only one second electrode layer 14*b* may be disposed on the upper surface of the second semiconductor layer 13. Each of the first electrode layer 14*a* and the second electrode layer 14*b* may include at least one of the materials included in the electrode layer 14 of FIG. 5**.

The following embodiments are described as an example to which the light emitting element LD shown in FIGS. 1 and 2 is applied, but a person skilled in the art may apply various shapes of light emitting elements including the light emitting element LD shown in FIGS. 3 to 7 to embodiments.

Figure 8:
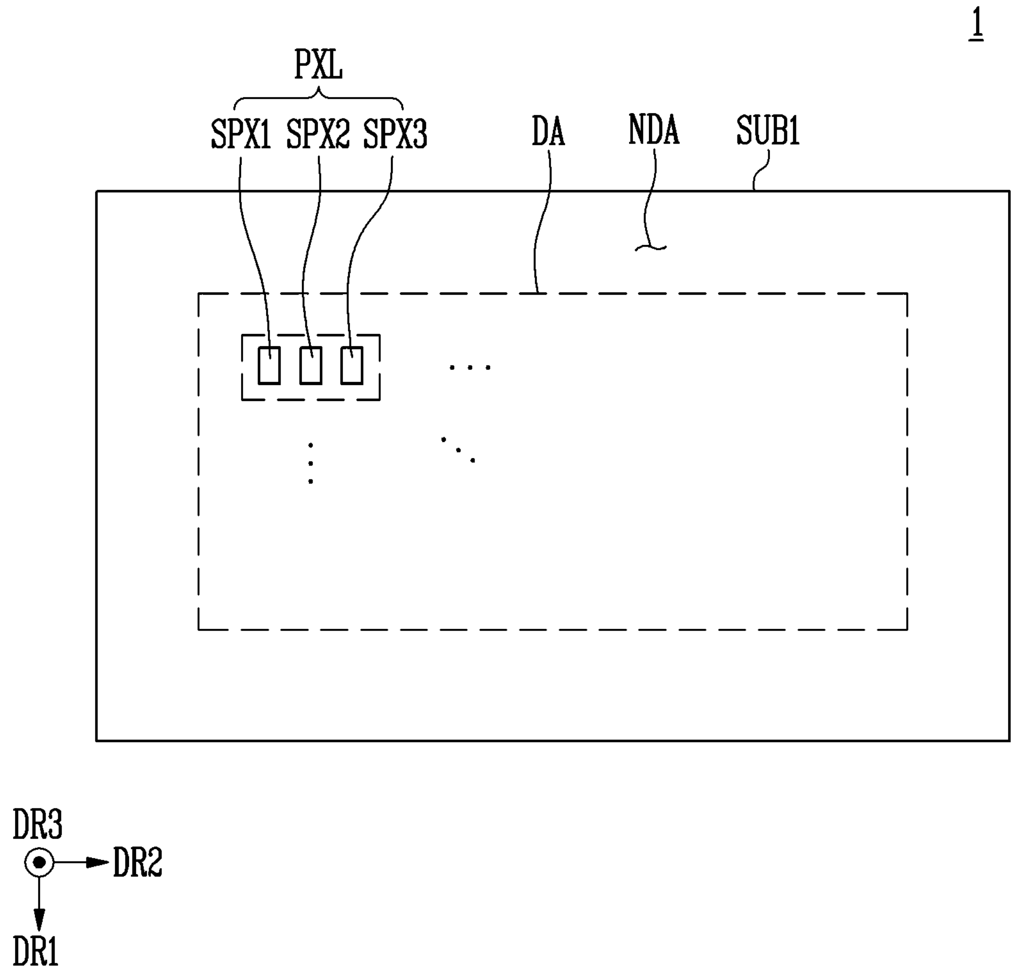
FIG. 8 is a schematic diagram illustrating a display panel according to an embodiment.

FIG. 8 is a schematic diagram illustrating a display panel according to an embodiment.

The display panel 1 may be used as a display panel of a large-sized display device such as a television and a monitor and a small and medium-sized display device such as a mobile phone, a tablet, a car navigation system, a game machine, and a smart watch.

Referring to FIG. 8, according to an embodiment, the display panel 1 may have a rectangular shape longer in a second direction DR2 than in a first direction DR1. A thickness direction of the display panel 1 is indicated by a third direction DR3. However, directions indicated by the first, second, and third directions DR1, DR2, and DR3 may be converted into other directions as a relative concept. Hereinafter, the first, second, and third directions DR1, DR2, and DR3 refer to the same reference numerals as directions respectively indicated by the first, second, and third directions DR1, DR2 and DR3. For example, a shape of the display panel 1 is not limited to the shown shape, and may have various shapes.

The display panel 1 may include a base layer SUB1 (e.g., a substrate), and pixels PXL disposed on the base layer SUB1. For example, the display panel 1 and the base layer SUB1 may include a display area DA in which an image is displayed and a non-display area NDA except for the display area DA.

The display area DA and the non-display area NDA may be defined in the base layer SUB1. According to an embodiment, the display area DA may be disposed in a center area of the display panel 1, and the non-display area NDA may be disposed along an edge of the display panel 1 to surround the display area DA. However, positions of the display area DA and the non-display area NDA are not limited thereto, and the positions thereof may be changed or varied.

The base layer SUB1 may be used as a base member of the display panel 1. For example, the base layer SUB1 may be used as a base member of a lower panel (for example, a lower plate of the display panel 1).

According to an embodiment, the base layer SUB1 may be a rigid substrate or a flexible substrate, and a material or a physical property thereof is not particularly limited thereto. For example, the base layer SUB1 may be a rigid substrate formed of glass or tempered glass, or a flexible substrate formed of a thin film of a plastic or metal material. For example, the base layer SUB1 may be a transparent substrate, but embodiments are not limited thereto. For example, the base layer SUB1 may be a translucent substrate, an opaque substrate, or a reflective substrate.

One area on the base layer SUB1 is defined as the display area DA in which the pixels PXL are disposed, and the remaining area is defined as the non-display area NDA in which the pixels PXL are not disposed. For example, the base layer SUB1 may include the display area DA including a plurality of light emitting areas in which the pixel PXL is formed and the non-display area NDA disposed outside the display area DA. In the non-display area NDA, various lines connected to the pixels PXL of the display area DA, and/or an internal circuit unit may be disposed.

The pixel PXL may include at least one light emitting element LD driven by a corresponding scan signal and data signal, for example, at least light emitting diode by any one of the embodiments of FIGS. 1 to 7. The plurality of rod shape light emitting diodes may be used as a light source of the pixel PXL.

For example, the pixel PXL may include a plurality pixels. For example, the pixel PXL may include a first sub-pixel SPX1, a second sub-pixel SPX2, and a third sub-pixel SPX3. According to an embodiment, the first, second, and third sub-pixels SPX1, SPX2, and SPX3 may emit light of different colors. For example, the first sub-pixel SPX1 may be a red sub-pixel emitting red light, the second sub-pixel SPX2 may be a green sub-pixel emitting green light, and the third sub-pixel SPX3 may be a blue sub-pixel emitting blue light. However, a color, a type, the number, and/or the like of sub-pixels of the pixel PXL are/is not particularly limited thereto, and for example, a color of light emitted by each of the sub-pixels may be variously changed.

For example, according to an embodiment, the first, second, and third sub-pixels SPX1, SPX2, and SPX3 may emit light of the substantially same color. For example, all of the first, second, and third sub-pixels SPX1, SPX2, and SPX3 may be sub-pixels emitting light of red, green, or blue color. In this case, in order to form a pixel PXL of full color, a light conversion layer and/or a color filter for converting light emitted from a corresponding unit pixel may be disposed on at least a portion of first to third unit pixels SSPX1 to SSPX3.

For example, although FIG. 8 shows an embodiment in which the sub-pixels SPX1, SPX2, and SPX3 are arranged in a stripe shape in the display area DA, embodiments are not limited thereto. For example, the pixels PXL may be arranged in various currently known pixel arrangement types.

Figure 9:
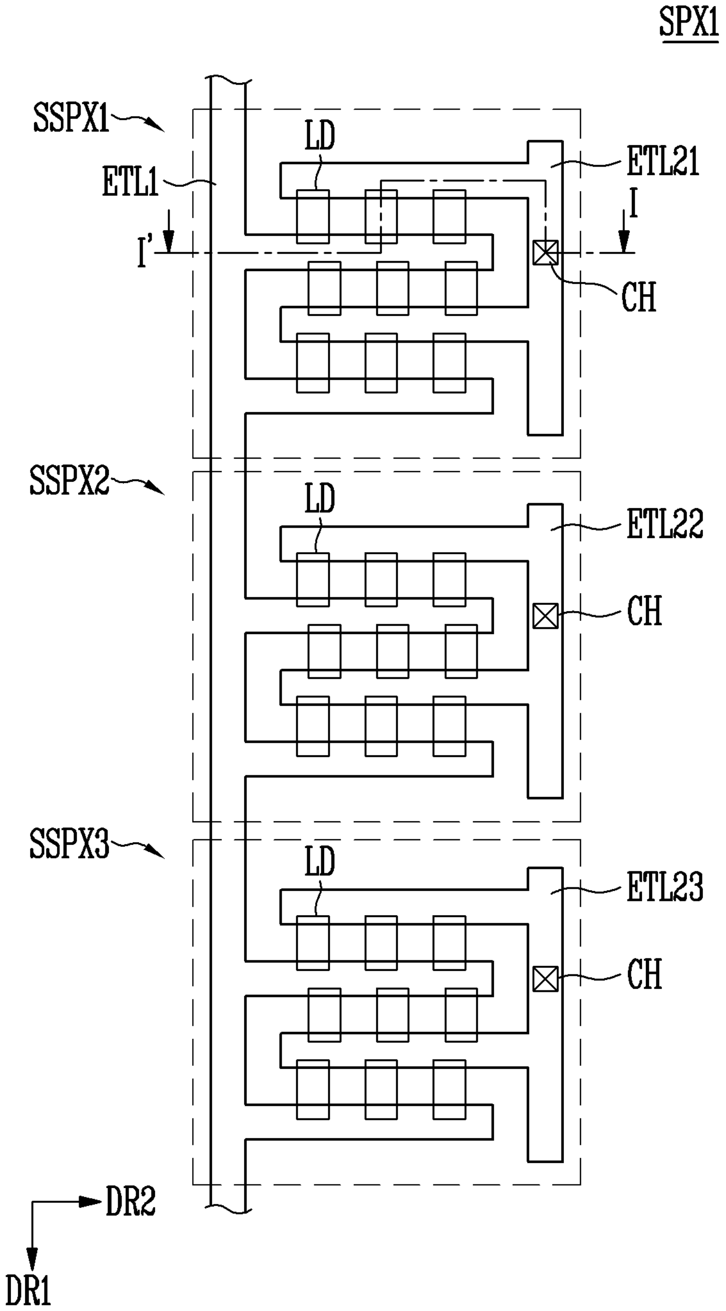
FIG. 9 is a plan layout view illustrating a disposition of a partial configuration in one sub-pixel included in the display panel of FIG. 8.

According to an embodiment, each of the sub-pixels SPX1, SPX2, and SPX3 may include a plurality of unit pixels SSPX1, SSPX2, SSPX3 (refer to FIG. 9). Each of the unit pixels may be connected to a scan line and a data line, and may also be connected to a high potential power line and a low potential power line. Each of the unit pixels may emit light with a luminance corresponding to a data signal transmitted through the data line in response to a scan signal transmitted through the scan line. The unit pixels may include substantially the same pixel structure or pixel circuit. For example, the first sub-pixel SPX1 may include unit pixels that mutually independently emit light in response to one scan signal and one data signal.

For example, a plurality of pads may be disposed in the non-display area NDA. Lines in the display panel 1 may be electrically connected to a driver IC positioned outside the display panel 1 through the pads.

FIG. 9 is a schematic plan layout view illustrating a disposition of a partial configuration in one sub-pixel included in the display panel of FIG. 8.

Referring to FIG. 8, the first unit pixel SSPX1 may include a first electrode ETL1 and second electrodes ETL21, ETL22, and ETL23 disposed to be spaced apart from each other, and at least one light emitting element LD connected between the first electrode ETL1 and the second electrodes ETL21, ETL22, and ETL23.

According to an embodiment, the first electrode ETL1 may be an electrode shared by the first to third unit pixels SSPX1 to SSPX3. In this case, the first to third unit pixels SSPX1 to SSPX3 may be disposed along the first direction DR1.

The second electrodes ETL21, ETL22, and ETL23 may be disposed to be spaced apart from the first electrode ETL1 at one side in the second direction DR2. The second electrodes ETL21, ETL22, and ETL23 in the first to third unit pixels SSPX1 to SSPX3 may be arranged in the first direction DR1.

The first electrode ETL1 and the second electrodes ETL21, ETL22, and ETL23 may be spaced apart from each other by a distance and disposed side by side (e.g., in parallel).

According to an embodiment, the first electrode ETL1 may be a cathode electrode electrically connected to low potential power. The second electrodes ETL21, ETL22, and ETL23 may be anode electrodes electrically connected to high potential power. As the light emitting elements LD having one end and another end electrically connected to the first electrode ETL1 and the second electrodes ETL21, ETL22, and ETL23, respectively are disposed, the first electrode ETL1 and each of the second electrodes ETL21, ETL22, and ETL23 may be electrically connected.

According to an embodiment, one emission area may be defined as one unit pixel (for example, SSPX1). The emission area may be divided by the non-emission area. For example, a pixel defining layer (e.g., a bank, or a light blocking pattern) or the like that blocks light emitted from the light emitting element LD from being transmitted to another area may be disposed in the non-emission area or may overlap the non-emission area. In the descriptions, when expressed as "overlap", the "overlap" means that two configurations overlap in a thickness direction (e.g., a direction perpendicular to a surface of the base layer SUB1 or the third direction DR3) of the display panel 1 unless otherwise defined.

Figure 10:
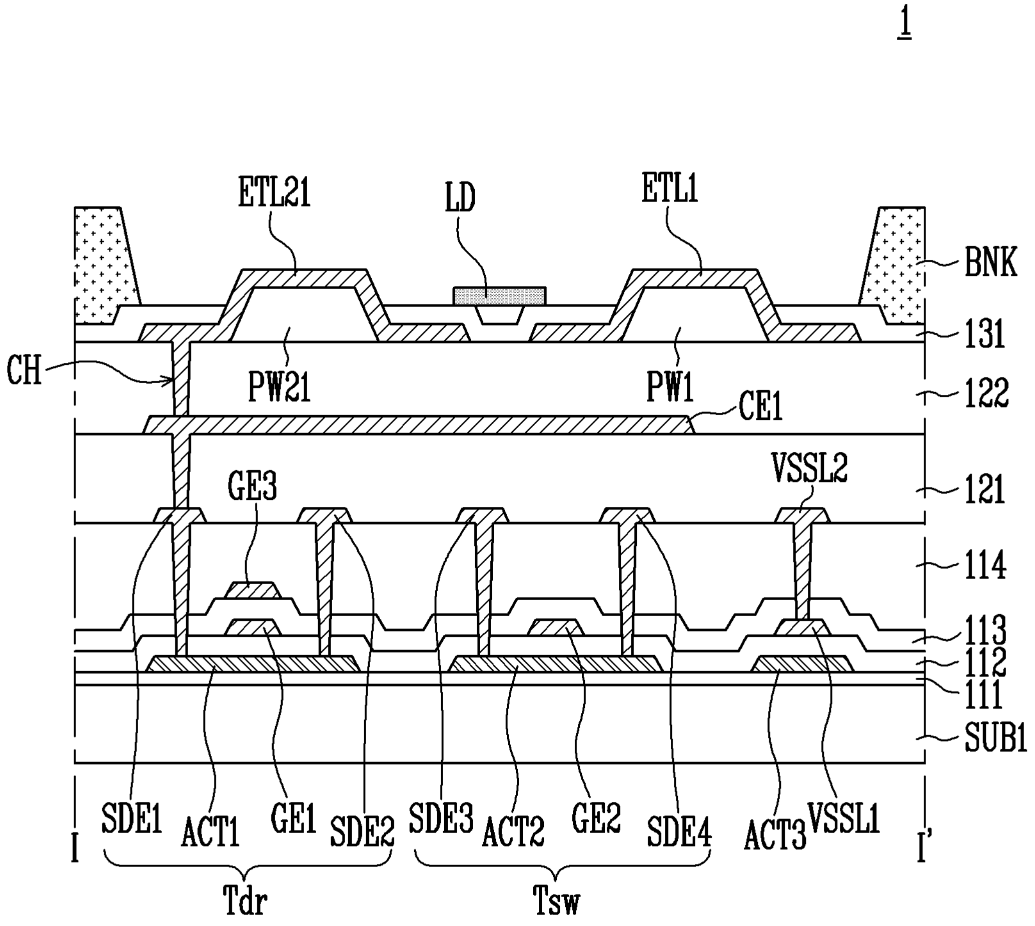
FIG. 10 is a schematic cross-sectional view of the display panel taken along line I-I' of FIG. 9.

FIG. 10 is a schematic cross-sectional view of the display panel taken along line I-I' of FIG. 9.

The cross-section of the display panel 1 shown in FIG. 10 may be a cross-section of the display panel 1 before manufacturing is completed. For example, the cross-section of the shown display panel 1 may become an object of inspection or measurement, and a subsequent process may be performed on the shown display panel 1 after an inspection step by an inspection device according to an embodiment.

Referring to FIG. 10, the display panel 1 may include a base layer SUB1 disposed thereunder. Since a description of the base layer SUB1 is described above, a redundant description is omitted.

A first buffer layer 111 may be disposed on the base layer SUB1. The first buffer layer 111 may perform a function of smoothing a surface of the base layer SUB1 and preventing penetration of moisture or external air. The first buffer layer 111 may be an inorganic layer. The first buffer layer 111 may be in the form of a single layer or multiple layers.

A plurality of transistors Tdr and Tsw may be disposed on the first buffer layer 111. For example, each of the transistors Tdr and Tsw may be a thin film transistor. The two transistors Tdr and Tsw shown in the drawing correspond to a driving transistor and a switch transistor, respectively.

The respective transistors Tdr and Tsw may include semiconductor patterns ACT1 and ACT2, gate electrodes GE1 and GE2, source electrodes SDE2 and SDE4, and drain electrodes SDE1 and SDE3, respectively. For example, the first transistor Tdr in the form of the driving transistor may include a first semiconductor pattern ACT1, a first gate electrode GE1, a first source electrode SDE2, and a first drain electrode SDE1. The second transistor Tsw in the form of the switch transistor may include a second semiconductor pattern ACT2, a second gate electrode GE2, a second source electrode SDE4, and a second drain electrode SDE3.

For example, a panel semiconductor layer may be disposed on the first buffer layer 111. The panel semiconductor layer may include the first semiconductor pattern ACT1 and the second semiconductor pattern ACT2. For example, the panel semiconductor layer may further include a third semiconductor pattern ACT3.

According to an embodiment, at least a portion of the first semiconductor pattern ACT1, the second semiconductor pattern ACT2, and the third semiconductor pattern ACT3 may be a pattern formed to be separated from each other. For example, according to an embodiment, the first semiconductor pattern ACT1, the second semiconductor pattern ACT2, and the third semiconductor pattern ACT3 may be patterns positioned in different areas extending from one pattern.

The panel semiconductor layer may include amorphous silicon, poly silicon, low temperature poly silicon, and an organic semiconductor. In another embodiment, the panel semiconductor layer may be an oxide semiconductor. For example, the panel semiconductor layer may include a channel region, and a source region and a drain region disposed on both sides of the channel region and doped with impurities.

A first gate insulating layer 112 may be disposed on the panel semiconductor layer. The first gate insulating layer 112 may be an inorganic layer. The first gate insulating layer 112 may be in the form of a single layer or multiple layers.

A first conductive layer may be disposed on the first gate insulating layer 112. The first conductive layer may include the first gate electrode GE1 and the second gate electrode GE2. For example, the first conductive layer may further include a first low power pattern VSSL1. The first conductive layer may be formed of a metal material having conductivity. For example, the first conductive layer may include molybdenum (Mo), aluminum (Al), copper (Cu), and titanium (Ti). The first conductive layer may be in the form of a single layer or multiple layers.

The first low power pattern VSSL1 may be electrically connected to a second power line. The first low power pattern VSSL1 may be disposed in the display area DA and may overlap the third semiconductor pattern ACT3.

A second gate insulating layer 113 may be disposed on the first conductive layer. The second gate insulating layer 113 may be an inorganic layer. The second gate insulating layer 113 may be in the form of a single layer or multiple layers.

A second conductive layer may be disposed on the second gate insulating layer 113. The second conductive layer may include a third gate electrode GE3. The third gate electrode GE3 may be a gate electrode of another transistor, but embodiments are not limited thereto. The second conductive layer may be formed of a metal material having conductivity. For example, the second conductive layer may include molybdenum (Mo), aluminum (Al), copper (Cu), and titanium (Ti). The second conductive layer may be in the form of a single layer or multiple layers.

An interlayer insulating layer 114 may be disposed on the second conductive layer. The interlayer insulating layer 114 may be an organic layer or an inorganic layer. The interlayer insulating layer 114 may be in the form of a single layer or multiple layers.

A third conductive layer may be disposed on the interlayer insulating layer 114. The third conductive layer may include the source electrodes SDE2 and SDE4 and the drain electrodes SDE1 and SDE3. For example, the third conductive layer may further include a second low power pattern VSSL2. The third conductive layer is formed of a metal material having conductivity. For example, the source electrodes SDE2 and SDE4, the drain electrodes SDE1 and SDE3, and the second low power pattern VSSL2 may include aluminum (Al), copper (Cu), titanium (Ti), and molybdenum (Mo).

The second low power pattern VSSL2 may be electrically connected to the second power line. The second low power pattern VSSL2 may contact the first low power pattern VSSL1 through a contact hole passing the second gate insulating layer 113 and the interlayer insulating layer 114. The second low power pattern VSSL2 may be disposed in the display area DA and may overlap the first low power pattern VSSL1 and the third semiconductor pattern ACT3.

The source electrodes SDE2 and SDE4 and the drain electrodes SDE1 and SDE3 are not limited to their element names. In another embodiment, the source electrodes SDE2 and SDE4 shown in FIG. 14 may perform a function of a drain electrode, and the drain electrodes SDE1 and SDE3 shown in FIG. 14 may perform a function of a source electrode.

The source electrodes SDE2 and SDE4 and the drain electrodes SDE1 and SDE3 may be respectively connected to the source regions and the drain regions of each of corresponding semiconductor patterns ACT1 and ACT2 through a contact hole passing through the interlayer insulating layer 114, the second gate insulating layer 113, and the first gate insulating layer 112.

For example, the display panel 1 may further include a storage capacitor disposed on the base layer SUB1.

A first protection layer 121 may be disposed on the third conductive layer. For example, the first protection layer 121 may be disposed to cover a circuit unit including the transistors Tdr and Tsw. The first protection layer 121 may also be disposed in at least a portion of the non-display area NDA. The first protection layer 121 may be a passivation layer or a planarization layer. The passivation layer may include $SiO_2$, SiNx, or the like, and the planarization layer may include a material such as acrylic or polyimide. The first protection layer 121 may include both of the passivation layer and the planarization layer. In this case, the passivation layer may be disposed on the third conductive layer and the interlayer insulating layer 114, and the planarization layer may be disposed on the passivation layer. An upper surface of the first protection layer 121 may be substantially flat.

A fourth conductive layer may be disposed on the first protection layer 121. The fourth conductive layer may include various conductive patterns and the like such as a power line, a signal line, and a connection electrode. In the drawing, it is illustrated as an example that the fourth conductive layer includes a first connection pattern CE1 disposed in the display area DA. The fourth conductive layer is formed of a metal material having conductivity. For example, the fourth conductive layer may include aluminum (Al), copper (Cu), titanium (Ti), and molybdenum (Mo).

The first connection pattern CE1 may contact any one of the source electrode SDE2 and the drain electrode SDE1 of the first transistor Tdr through a contact hole passing through the first protection layer 121.

A second protection layer 122 may be disposed on the fourth conductive layer. The second protection layer 122 may be a passivation layer or a planarization layer. The passivation layer may include $SiO_2$, SiNx, or the like, and the planarization layer may include a material such as acrylic or polyimide. The second protection layer 122 may include both of the passivation layer and the planarization layer.

For example, the second protection layer 122 may include an opening exposing an upper portion of a partial member of a partial fourth conductive layer included in the fourth conductive layer. For example, the second protection layer 122 may include an opening exposing at least a portion of the first connection pattern CE1.

In the descriptions, the base layer SUB1 to the second protection layer 122 are referred to as a pixel circuit layer.

Based on the display area DA, the display panel 1 may include first and second partition walls PW1 and PW21, the first and second electrodes ETL1 and ETL21, a first insulating layer 131, the bank BNK, and the light emitting elements LD sequentially disposed on the pixel circuit layer. A display panel 1*a* may further include first and second contact electrodes CNE1 and CNE21, a second insulating layer 132, a third insulating layer 133, a fourth insulating layer 141, and a thin film encapsulation layer 151 (refer to FIG. 34) by a subsequent process after the inspection step by the inspection device according to an embodiment, and a description thereof will be described later in FIG. 34.

Although it is illustrated that the above-described elements are directly and sequentially disposed on the second protection layer 122 in the drawing, some elements may be omitted, or another element may be further disposed between some elements.

The first and second partition walls PW1 and PW21 may be disposed on the pixel circuit layer (e.g., the second protection layer 122). The first and second partition walls PW1 and PW21 may protrude in the thickness direction (for example, the third direction DR3) on the pixel circuit layer. According to an embodiment, the first and second partition walls PW1 and PW21 may have substantially the same height, but are not limited thereto. For example, protrusion heights of the first and second partition walls PW1 and PW21 may be about 1.0 μm to about 1.5 μm, respectively.

According to an embodiment, the first partition wall PW1 may be disposed between the pixel circuit layer and the first electrode ETL1. The second partition wall PW21 may be disposed between the pixel circuit layer and the second electrodes ETL21, ETL22, and ETL23.

According to an embodiment, the first and second partition walls PW1 and PW21 may have various shapes. As an example, the first and second partition walls PW1 and PW21 may have a trapezoidal cross-sectional shape in which a width becomes narrower toward an upper portion as shown in the drawing. In this case, each of the first and second partition walls PW1 and PW21 may have an inclined surface on at least one side surface.

For example, as another example, the first and second partition walls PW1 and PW21 may have a semi-circular or semi-elliptical cross-section in which a width becomes narrower as moving toward an upper portion. In this case, each of the first and second partition walls PW1 and PW21 may have a curved surface on at least one side surface. For example, the shape of the first and second partition walls PW1 and PW21 is not particularly limited thereto, and may be variously changed. For example, according to an embodiment, at least one of the first and second partition walls PW1 and PW21 may be omitted, or a position thereof may be changed.

The first and second partition walls PW1 and PW21 may include an insulating material including an inorganic material and/or an organic material. For example, the first and second partition walls PW1 and PW21 may include at least one inorganic layer including various currently known inorganic insulating materials including SiNx, SiOx, or the like. Alternatively, the first and second partition walls PW1 and PW21 may include at least one organic layer including various currently known organic insulating materials, a photoresist layer, and/or the like, or may be formed of an insulator of a single layer or multiple layers including organic/inorganic materials in combination. For example, a configuration material of the first and second partition walls PW1 and PW21 may be variously changed.

According to an embodiment, the first and second partition walls PW1 and PW21 may function as a reflective member. As an example, the first and second partition walls PW1 and PW21 may function as a reflective member that guides the light emitted from each light emitting element LD in a desired direction together with the first and second electrodes ETL1 and ETL21 provided thereon to improve light efficiency of the pixel PXL.

The first and second electrodes ETL1 and ETL21 may be respectively disposed on the first and second partition walls PW1 and PW21. The first and second electrodes ETL1 and ETL21 may be disposed to be spaced apart from each other. The first and second electrodes ETL1 and ETL21 may be formed on the same layer.

According to an embodiment, the first and second electrodes ETL1 and ETL21 or the like disposed on the first and second partition walls PW1 and PW2, respectively, may have shapes corresponding to shapes of each of the first and second partition walls PW1 and PW21. For example, each of the first and second electrodes ETL1 and ETL21 may have an inclined surface or a curved surface corresponding to the first and second partition walls PW1 and PW21 and may protrude in the thickness direction of the display panel 1.

Each of the first and second electrodes ETL1 and ETL21 may include at least one conductive material. For example, each of the first and second electrodes ETL1 and ETL21 may include a metal such as Ag, Mg, Al, Pt, Pd, Au, Ni, Nd, Ir, Cr, Ti, and an alloy thereof, a conductive oxide such as ITO, IZO, ZnO, and ITZO, and a conductive polymer such as PEDOT, but embodiments are not limited thereto.

For example, each of the first and second electrodes ETL1 and ETL21 may be formed as a single layer or multiple layers. For example, each of the first and second electrodes ETL1 and ETL21 may include at least one reflective electrode layer. For example, each of the first and second electrodes ETL1 and ETL21 may selectively further include at least one of at least one transparent electrode layer disposed on and/or under the reflective electrode layer and at least one conductive capping layer covering an upper portion of the reflective electrode layer and/or the transparent electrode layer.

According to an embodiment, the reflective electrode layers of each of the first and second electrodes ETL1 and ETL21 may be formed of an electrode material having a substantially uniform reflectance. As an example, the reflective electrode layer may include at least one of a metal such as Ag, Mg, Al, Pt, Pd, Au, Ni, Nd, Ir, Cr, and an alloy thereof, but embodiments are not limited thereto. For example, the reflective electrode layer may be formed of various reflective electrode materials. When each of the first and second electrodes ETL1 and ETL21 includes a reflective electrode layer, the light emitted from the both ends of each of the light emitting elements LD (e.g., one ends and the other ends) may be allowed to be further progressed in a direction in which an image is displayed (for example, the third direction DR3 or a front direction). For example, when the first and second electrodes ETL1 and ETL21 have the inclined surfaces or the curved surfaces corresponding to the shapes of the first and second partition walls PW1 and PW21 and are disposed to face the one ends and the other ends of each of the light emitting elements LD, the light emitted from the one ends and the other ends of each of the light emitting elements LD may be reflected by the first and second electrodes ETL1 and ETL21 and may be further progressed in the front direction (for example, the third direction DR3 that is an upper direction of the base layer SUB1) of the display panel 1. Accordingly, efficiency of the light emitted from the light emitting elements LD may be improved or enhanced.

For example, the transparent electrode layers of each of the first and second electrodes ETL1 and ETL21 may be formed of various transparent electrode materials. As an example, the transparent electrode layer may include ITO, IZO, or ITZO, but embodiments are not limited thereto. In an embodiment, each of the first and second electrodes ETL1 and ETL21 may be formed as triple layers having a stack structure of ITO/Ag/ITO. For example, when the first and second electrodes ETL1 and ETL21 are formed as at least two or more multiple layers, a voltage drop due to a signal delay (e.g., RC delay) may be minimized or reduced. Accordingly, a desired voltage may be effectively transferred to the light emitting elements LD.

Additionally, when each of the first and second electrodes ETL1 and ETL21 includes the conductive capping layer covering the reflective electrode layer and/or the transparent electrode layer, the reflective electrode layer or the like of the first and second electrodes ETL1 and ETL21 may be prevented from being damaged due to a defect occurring in a manufacturing process or the like of the pixel PXL. However, the conductive capping layer may be selectively included in the first and second electrodes ETL1 and ETL21 and may be omitted according to an embodiment. For example, the conductive capping layer may be regarded as a component of each of the first and second electrodes ETL1 and ETL21 or regarded as a separate component disposed on the first and second electrodes ETL1 and ETL21.

According to an embodiment, the second electrodes ETL21, ETL22, and ETL23 may overlap the first connection pattern CE1 in at least a partial area. The second electrodes ETL21, ETL22, and ETL23 may contact the first connection pattern CE1 through first contact holes CH passing through the second protection layer 122.

The first insulating layer 131 may be disposed on one area of the first and second electrodes ETL1 and ETL21 in the display area DA. For example, the first insulating layer 131 may include an opening formed to cover one area of the first and second electrodes ETL1 and ETL21 and exposing another one area of the first and second electrodes ETL1 and ETL21.

For example, the first insulating layer 131 may be interposed between the first and second electrodes ETL1 and ETL21 and the light emitting elements LD, and may expose at least one area of each of the first and second electrodes ETL1 and ETL21. After the first and second electrodes ETL1 and ETL21 are formed, the first insulating layer 131 may be formed to cover the first and second electrodes ETL1 and ETL21, to prevent damage of the first and second electrodes ETL1 and ETL21 or precipitation of metal. For example, the first insulating layer 131 may stably support each light emitting element LD. According to an embodiment, the first insulating layer 131 may be omitted.

The light emitting elements LD may be supplied and aligned on an area in which the first insulating layer 131 is disposed between the first and second electrodes ETL1 and ETL21. For example, the light emitting elements LD may be supplied or inputted through an inkjet method or the like, and the light emitting elements LD may be aligned between the first and second electrodes ETL1 and ETL21 by an alignment voltage (e.g., alignment signal) applied to the first and second electrodes ETL1 and ETL21. For example, an ink used in the inkjet method may include a solvent and the light emitting elements LD, and a concentration of the light emitting elements LD in the ink may be a first concentration.

The bank BNK may be disposed on the first insulating layer 131. For example, the bank BNK may be formed between other sub-pixels to surround the sub-pixels (e.g., SPX1 to SPX3 of FIG. 9), and may form the pixel defining layer that partitions the emission area. A height of the bank BNK may be higher than a height of the partition walls PW1 and PW21.

According to embodiments, the bank BNK may not be disposed between unit pixels SSPX1 to SSPXk in the same sub-pixels SPX1 to SPX3, but embodiments are not limited thereto. For example, according to an embodiment, the bank BNK may be omitted.

Figure 11:
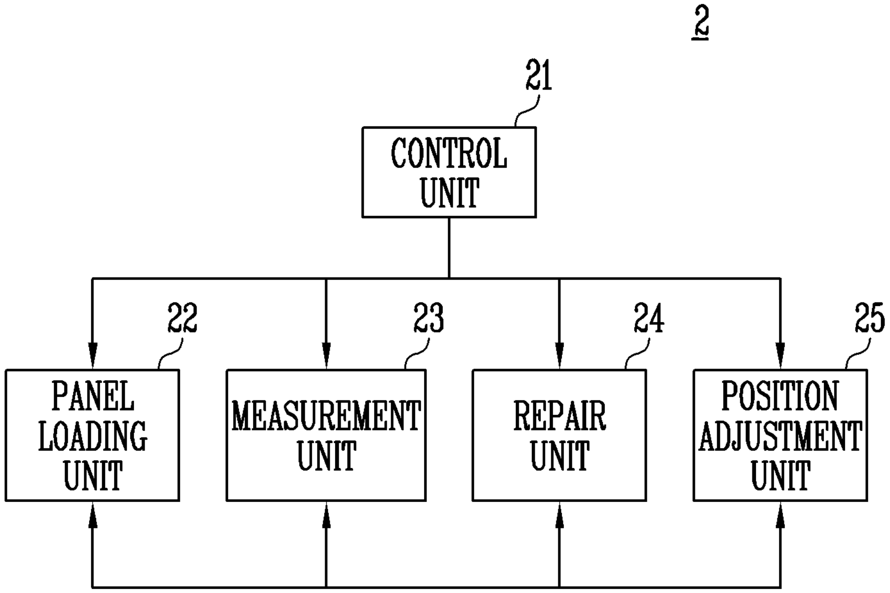
FIG. 11 is a schematic block diagram illustrating an inspection device according to an embodiment.
Figure 12:
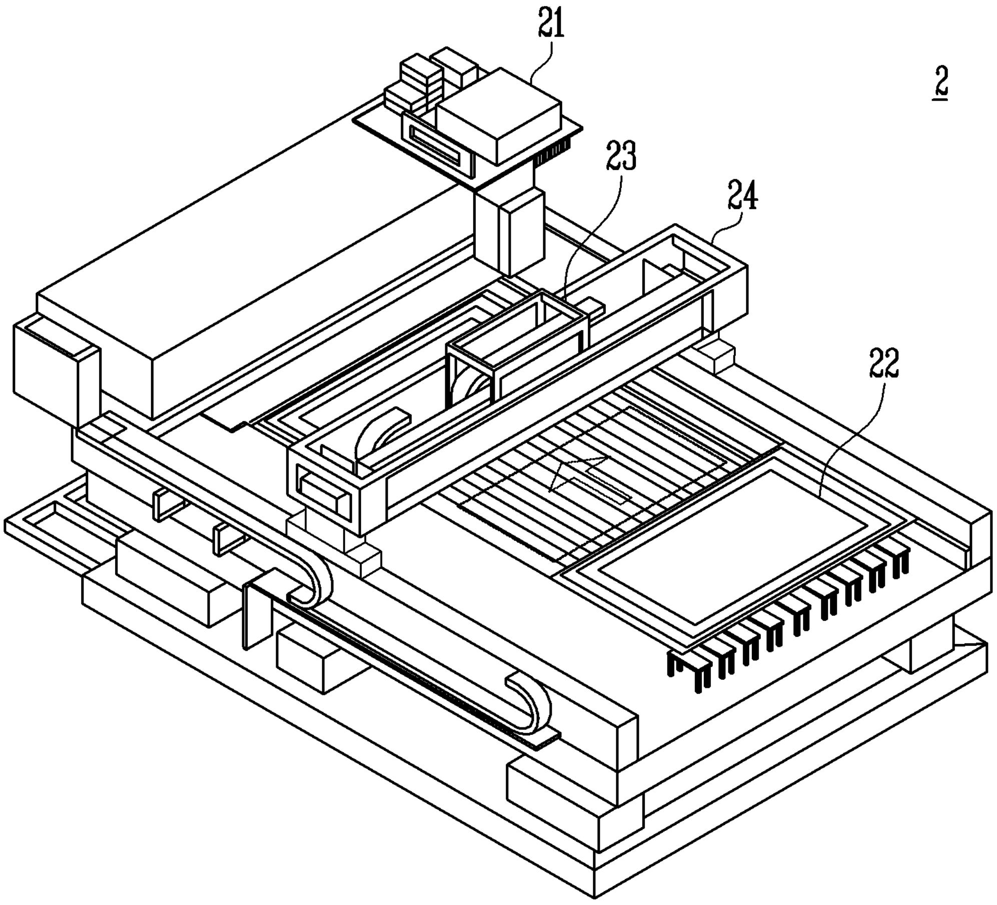
FIG. 12 is a schematic diagram illustrating an inspection device according to an embodiment.
Figure 13:
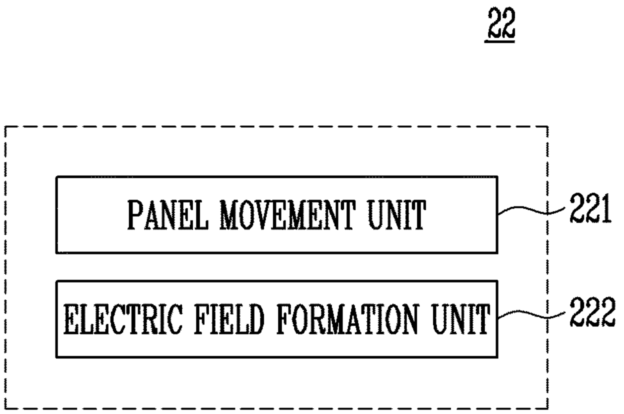
FIG. 13 is a schematic block diagram illustrating a panel loading unit according to an embodiment.
Figure 14:
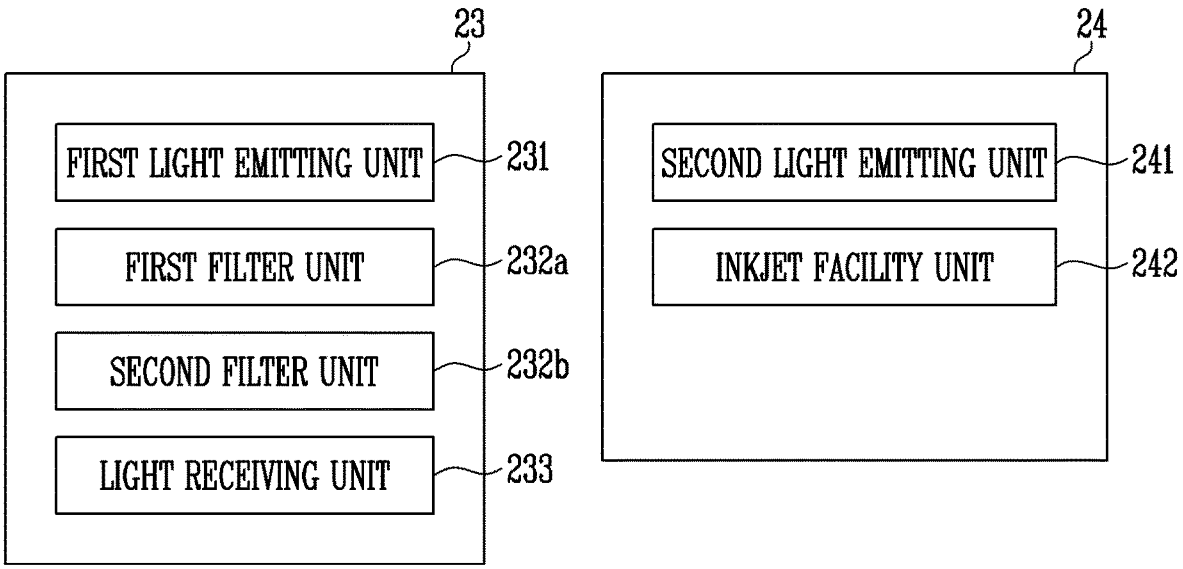
FIG. 14 is a schematic block diagram illustrating a measurement unit and a repair unit according to an embodiment.
Figure 15:
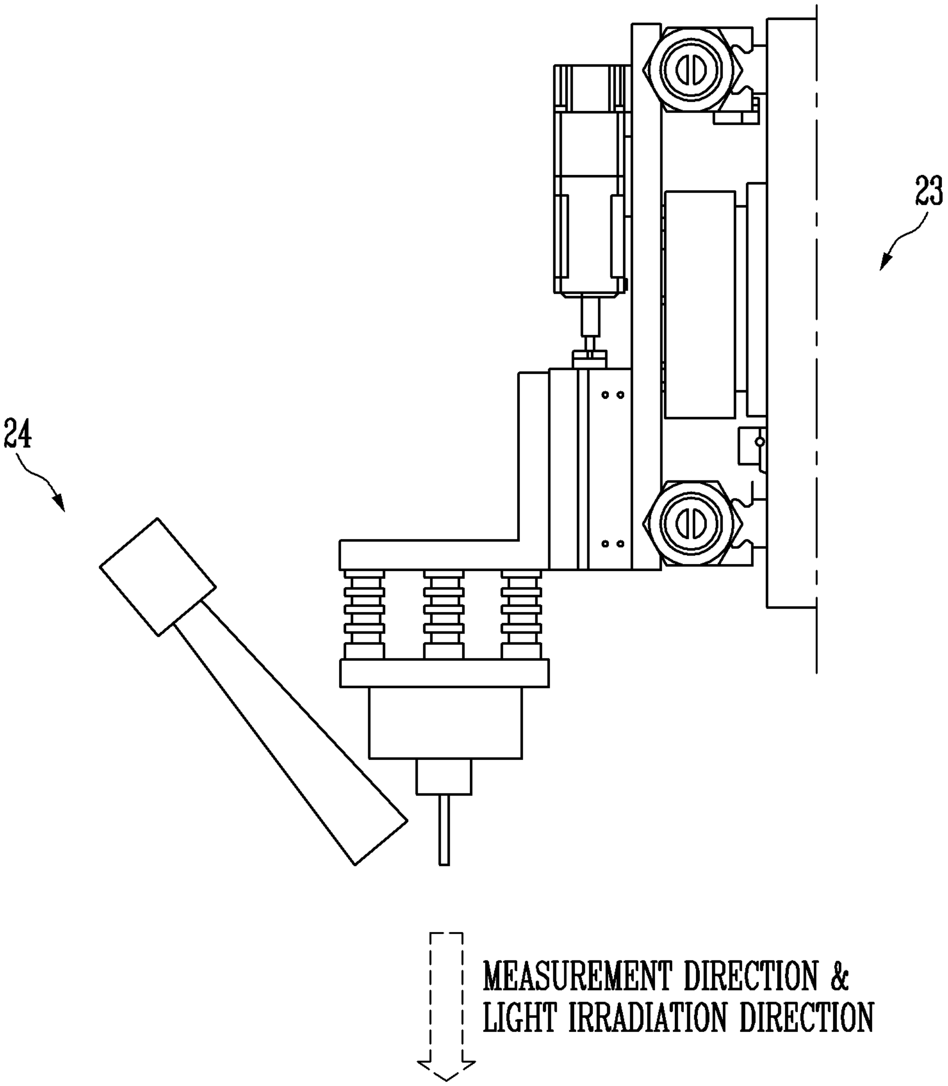
FIG. 15 is a schematic diagram illustrating a measurement unit and a repair unit according to an embodiment.

FIG. 11 is a schematic block diagram illustrating an inspection device according to an embodiment. FIG. 12 is a schematic diagram illustrating an inspection device according to an embodiment. FIG. 13 is a schematic block diagram illustrating a panel loader in the form of a panel loading unit according to an embodiment. FIG. 14 is a schematic block diagram illustrating a measurement unit (or a measurement part) and a repairer in the form of a repair unit according to an embodiment. FIG. 15 is a schematic diagram illustrating a measurement unit and a repair unit according to an embodiment.

A shape of the inspection device 2 shown in FIG. 12 is merely an example.

The inspection device 2 may inspect and repair the above-described display panel 1. For example, the inspection device 2 may include a function of measuring an alignment degree of the light emitting element LD in the display panel 1 and a function of increasing the alignment degree of the light emitting element LD in the display panel 1 through re-disposition of the light emitting element LD.

Referring to FIGS. 11 and 12, the inspection device 2 may include a controller in the form of a control unit 21, and a panel loading unit 22, a measurement unit 23, a repair unit 24, and a position adjuster in the form of a position adjustment unit 25 of which operations are controlled by the control unit 21. For example, the control unit 21 may control an overall operation of the panel loading unit 22, the measurement unit 23, the repair unit 24, and the position adjustment unit 25.

The control unit 21 may determine the alignment degree of the light emitting elements LD in the display panel 1, and determine whether the alignment degree is greater than or equal to a reference value. For example, the control unit 21 may move positions of the panel loading unit 22, the measurement unit 23, and the repair unit 24 through the position adjustment unit 25. In order to measure a front surface of the display panel 1 placed safely on the panel loading unit 22, the panel loading unit 22 and/or the measurement unit 23 may be moved so that the measurement unit 23 directly (or indirectly) face the front surface of the display panel 1.

Referring to FIG. 13 together, the panel loading unit 22 may include a panel mover in the form of a panel movement unit 221 and an electric field generator in the form of an electric field formation unit 222.

The panel loading unit 22 may receive the display panel 1 as an inspection object. According to an embodiment, the panel loading unit 22 may be disposed on a stage. The panel loading unit 22 may move the display panel 1 while receiving the display panel 1 through the panel movement unit 221 to repair the entire area of the display panel 1. The panel loading unit 22 may move in X-axis, Y-axis, and Z-axis directions. According to an embodiment, the display panel 1 may be cut into a cell unit that may be formed as one display device and may be received in the panel loading unit 22.

The panel loading unit 22 may form an electric field through the electric field formation unit 222. The panel loading unit 22 may form an electric field EF (refer to FIG. 18) for measuring or rearranging the alignment degree of the light emitting elements LD in the received display panel 1. According to an embodiment, the electric field formed by the electric field formation unit 222 may be formed between the first and second electrodes ETL1 and ETL21.

According to an embodiment, the electric field formation unit 222 may include a generator for forming the electric field, an amplifier, and an oscilloscope for checking an electric field formation state.

Referring to FIGS. 14 and 15 together, the measurement unit 23 may be provided with moving tools (or means) such as a lead frame that may move in the X-axis, Y-axis, and Z-axis directions on the panel loading unit 22, and may be formed in a gantry structure of an approximately ruler shape in which a lower portion is empty so that the display panel 1 received in the panel loading unit 22 is positioned. Accordingly, the measurement unit 23 may move left and right on the display panel 1 placed on the panel loading unit 22 and search and move an inspection area ISA.

The measurement unit 23 may include a first light emitter in the form of a first light emitting unit 231, a first filter in the form of a first filter unit 232*a*, a second filter in the form of a second filter unit 232*b*, and a light receiver in the form of a light receiving unit 233.

The first light emitting unit 231 may generate and emit light. The first light emitting unit 231 may include a first light source that generates ultraviolet ray (UV) to visible light having a wavelength of about 10 nm to about 700 nm, and a second light source that generates infrared ray (IR) having a wavelength of about 700 nm or more. The control unit 21 may control a movement direction and intensity of light generated from the first light source and the second light source.

According to an embodiment, the light generated from the first light source may have a wavelength of a different area according to a type of color emitted by the light emitting element LD. For example, first light having a first wavelength range may be irradiated or emitted to the first unit pixel SSPX1 including the light emitting elements LD that emit red light from the first light source, second light having a second wavelength range may be irradiated or emitted to the second unit pixel SSPX2 including the light emitting elements LD that emit green light, and third light having a third wavelength range may be irradiated or emitted to the third unit pixel SSPX3 including the light emitting elements LD that emit blue light.

According to an embodiment, each of the first light source and the second light source of the first light emitting unit 231 may be selected from among a mercury light source, an Fe-based metal halide-based light source, a Ga-based metal halide-based light source, and a semiconductor light source (e.g., laser, an LED, or the like).

The light generated from the first light source and the second light source may be irradiated or emitted to the inspection area ISA in the display panel 1 through the first filter unit 232*a*.

When light of a wavelength band having energy greater than or equal to a band gap of the active layer 12 is applied to each light emitting element LD, each light emitting element LD may emit fluorescence (FL) therein. For example, each light emitting element LD may emit the fluorescence therein by the first light source or the second light source irradiated or emitted to each light emitting element LD. For example, each light emitting element LD may emit excitation light after the light of the wavelength band having the energy greater than or equal to the band gap is applied.

The fluorescence and the excitation light emitted from each light emitting element LD may be collected by the light receiving unit 233 through the second filter unit 232*b*. For example, the second filter unit 232*b* may be a filter that blocks visible light of at least a partial area within a wavelength of about 400 nm to about 700 nm. According to an embodiment, the second filter unit 232*b* may transmit light of a specific color (e.g., a specific wavelength band) of the fluorescence and the excitation light emitted from each light emitting element LD.

The light receiving unit 233 may receive visual information on the fluorescence and the excitation light emitted from each light emitting element LD. According to an embodiment, the light receiving unit 233 may be formed in the form of a CCD camera, a pyrometer, or an infrared camera, but embodiments are not limited thereto.

The repair unit 24 may include a second light emitter in the form of a second light emitting unit 241 and an inkjet facility unit 242 (e.g., an inkjet facility part).

The second light emitting unit 241 may be a light source and may generate light. The second light emitting unit 241 may include a third light source that generates ultraviolet ray (UV) to visible light having a wavelength of about 10 nm to about 700 nm. According to an embodiment, the third light source of the second light emitting unit 241 may be selected from among a mercury light source, an Fe-based metal halide-based light source, a Ga-based metal halide-based light source, and a semiconductor light source (e.g., laser, an LED, or the like).

The light generated from the third light source may induce deflection rearrangement of the light emitting elements LD.

In an embodiment, the first light source and the second light source are described as separate components included in different first light emitting unit 231 and second light emitting unit 241, but embodiments are not limited thereto. In another embodiment, the first light source of the first light emitting unit 231 may be one light source that simultaneously performs a function of the third light source. In this case, the measurement unit 23 may include a partial function of the repair unit 24, and the repair unit 24 may include the inkjet facility unit 242 except for the second light emitting unit 241.

The inkjet facility unit 242 may provide the ink including the light emitting elements LD. According to an embodiment, the ink included in the inkjet facility unit 242 may include the solvent and the light emitting elements LD, and a concentration of the light emitting elements LD in the ink may be a second concentration lower than the first concentration described above.

Next, a method in which the inspection device 2 inspects and repairs the display device is described. For example, the following method relates to a method in which the inspection device 2 inspects and repairs the display panel 1 included in the display device.

Figure 16:
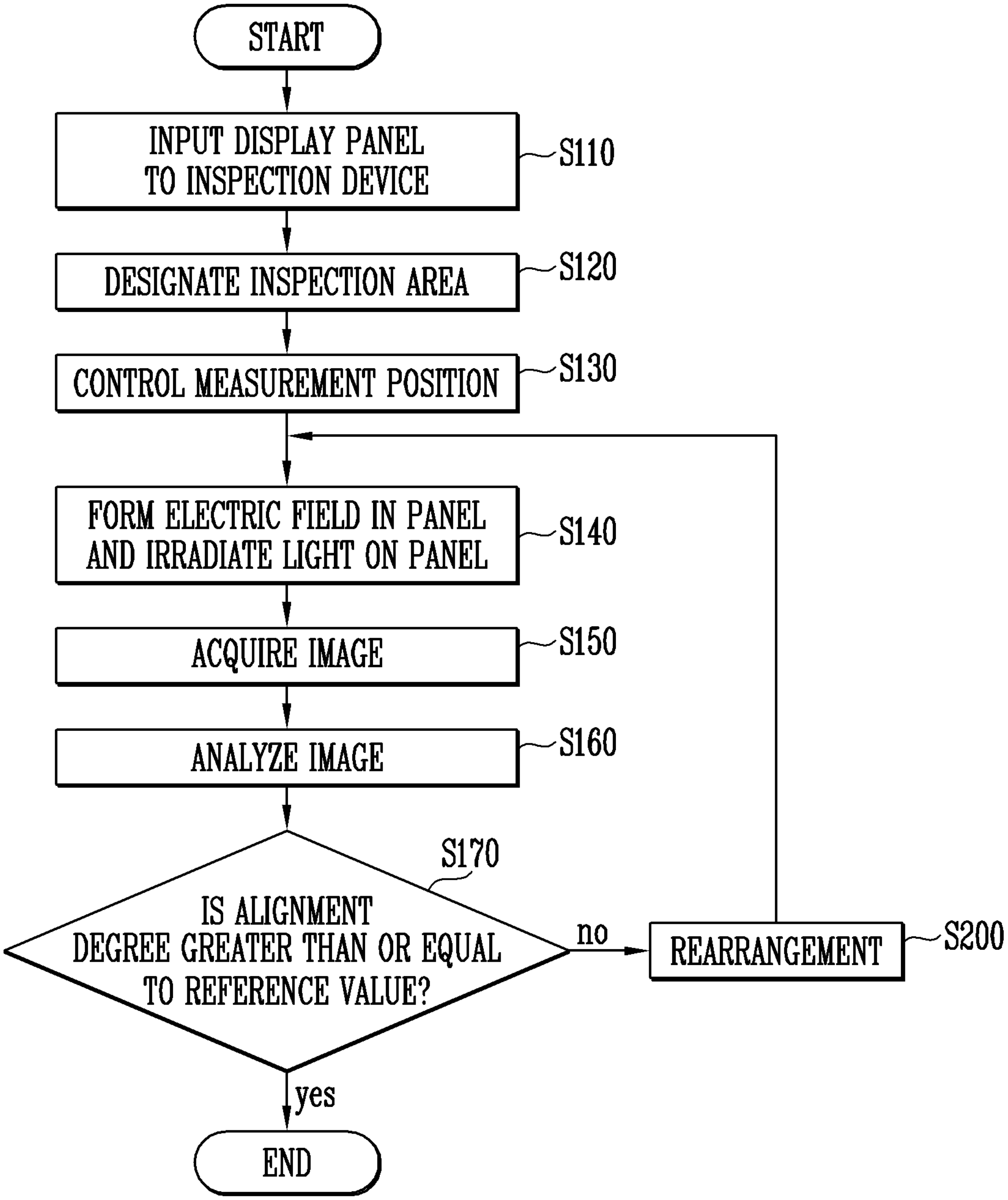
FIG. 16 is a flowchart illustrating a method in which an inspection device inspects and repairs a display device according to an embodiment.
Figure 17:
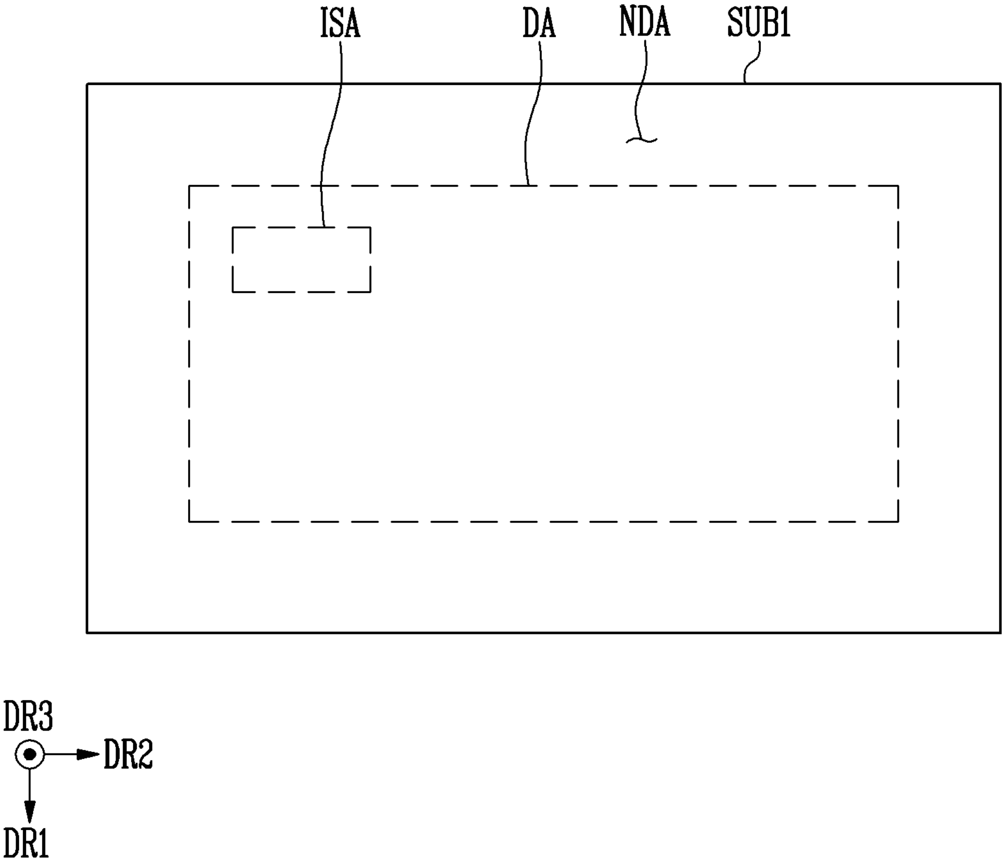
FIG. 17 is a schematic diagram illustrating the display panel for describing the flowchart of FIG. 16.
Figure 18:
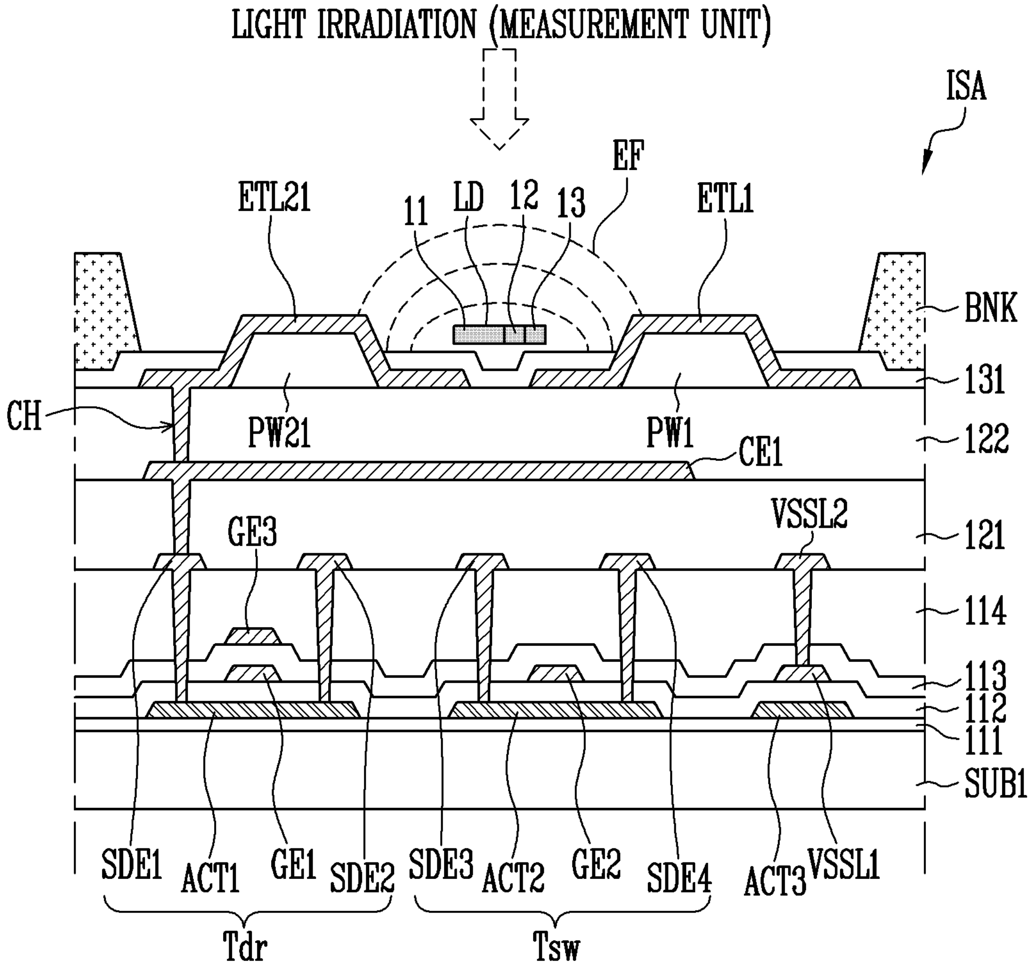
FIG. 18 is a schematic cross-sectional view of the display panel illustrating the flowchart of FIG. 16.
Figure 19:
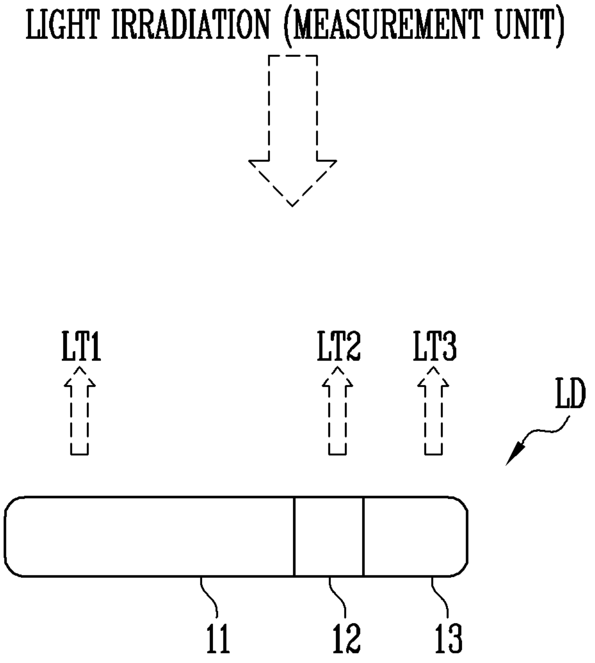
FIG. 19 is a schematic diagram illustrating an inspection area for describing the flowchart of FIG. 16.
Figure 20:
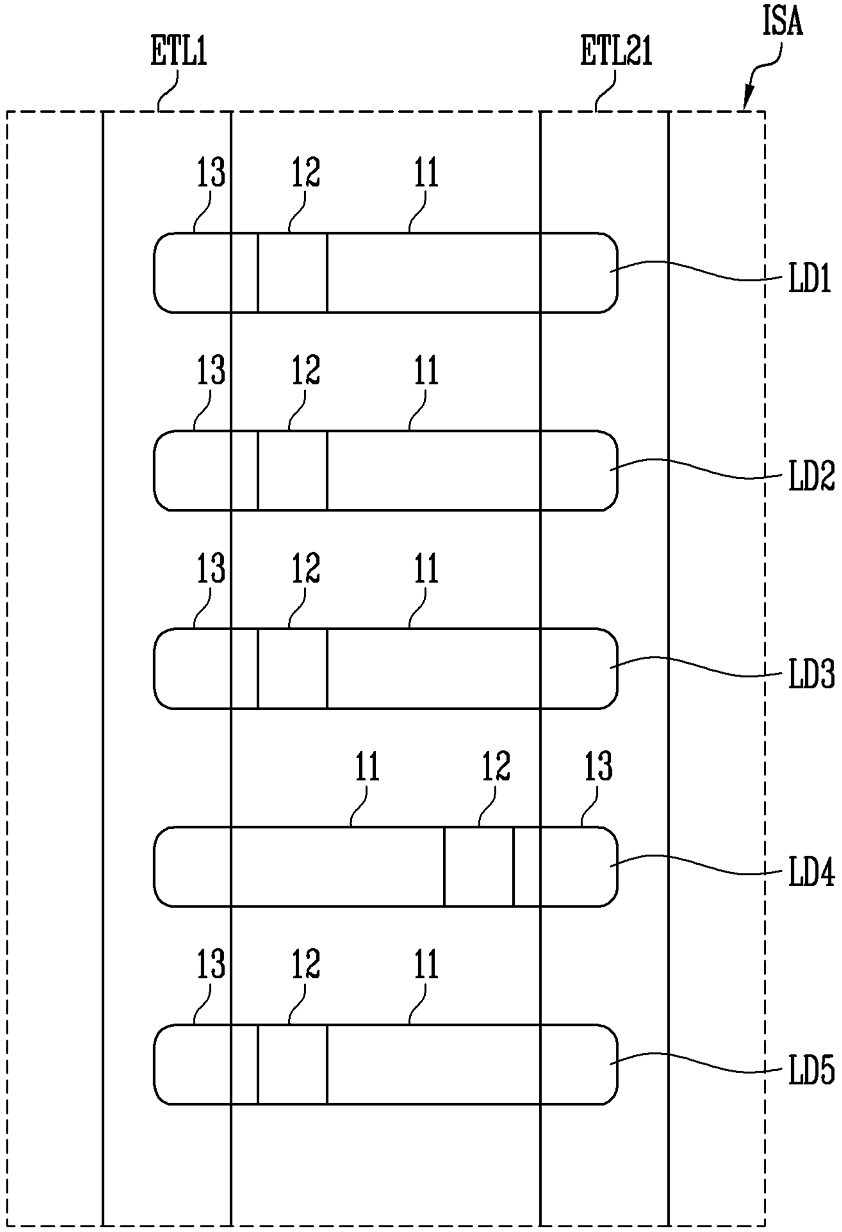
FIG. 20 is a schematic diagram illustrating a light emitting element for describing the flowchart of FIG. 16.
Figure 21:
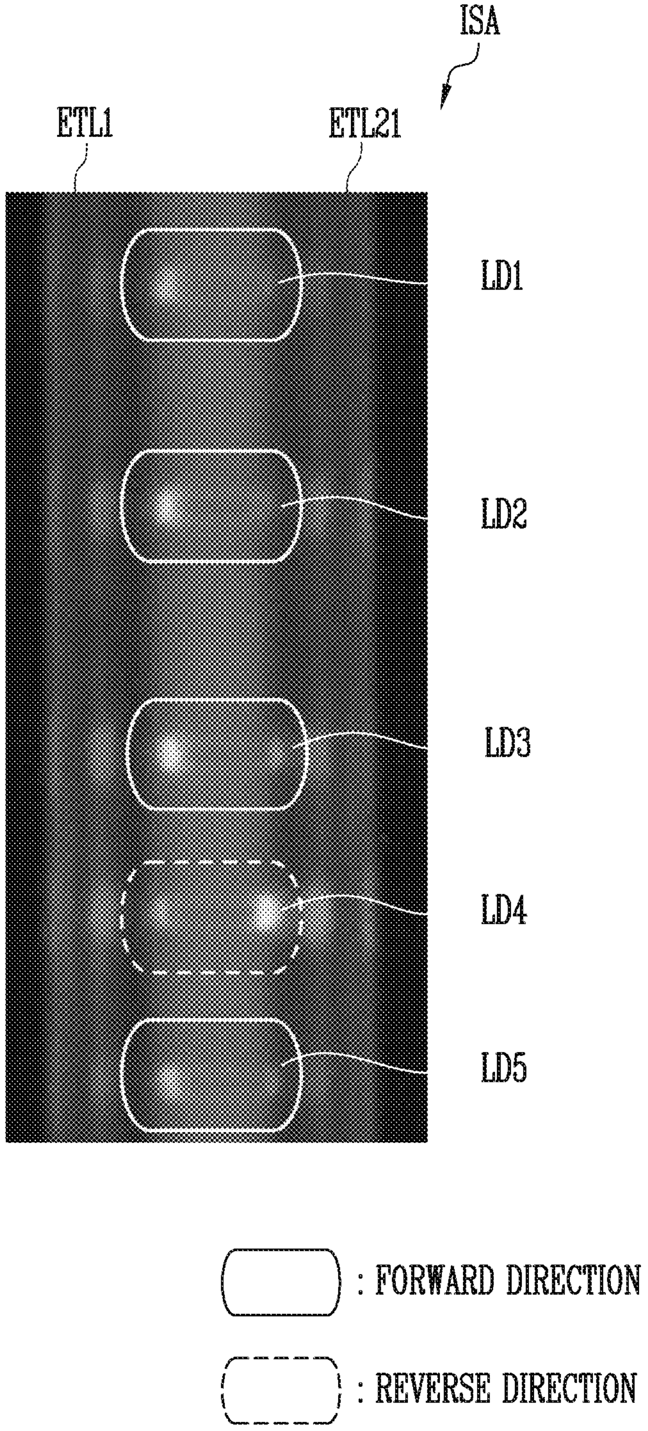
FIG. 21 is an image diagram illustrating the inspection area for describing the flowchart of FIG. 16.
Figure 22:
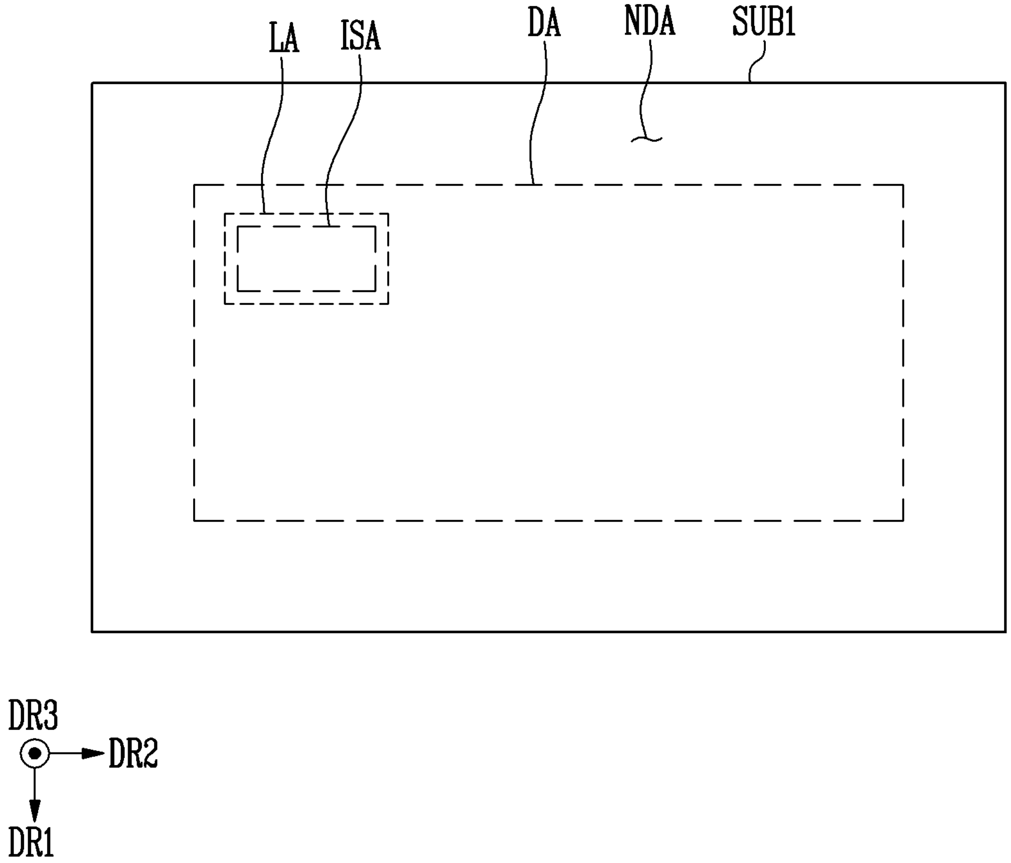
FIG. 22 is a schematic diagram illustrating the display panel for describing the flowchart of FIG. 16.
Figure 23:
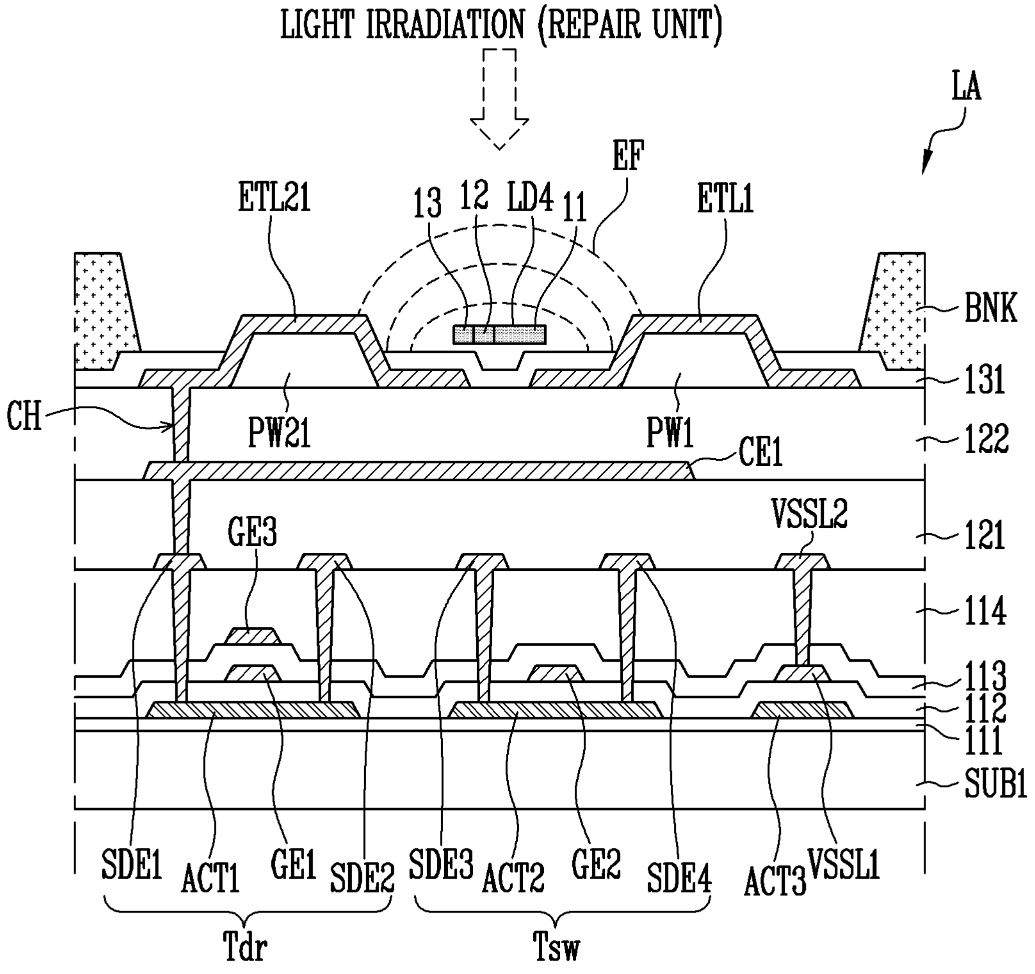
FIG. 23 is an image diagram illustrating the inspection area for describing the flowchart of FIG. 16.
Figure 24:
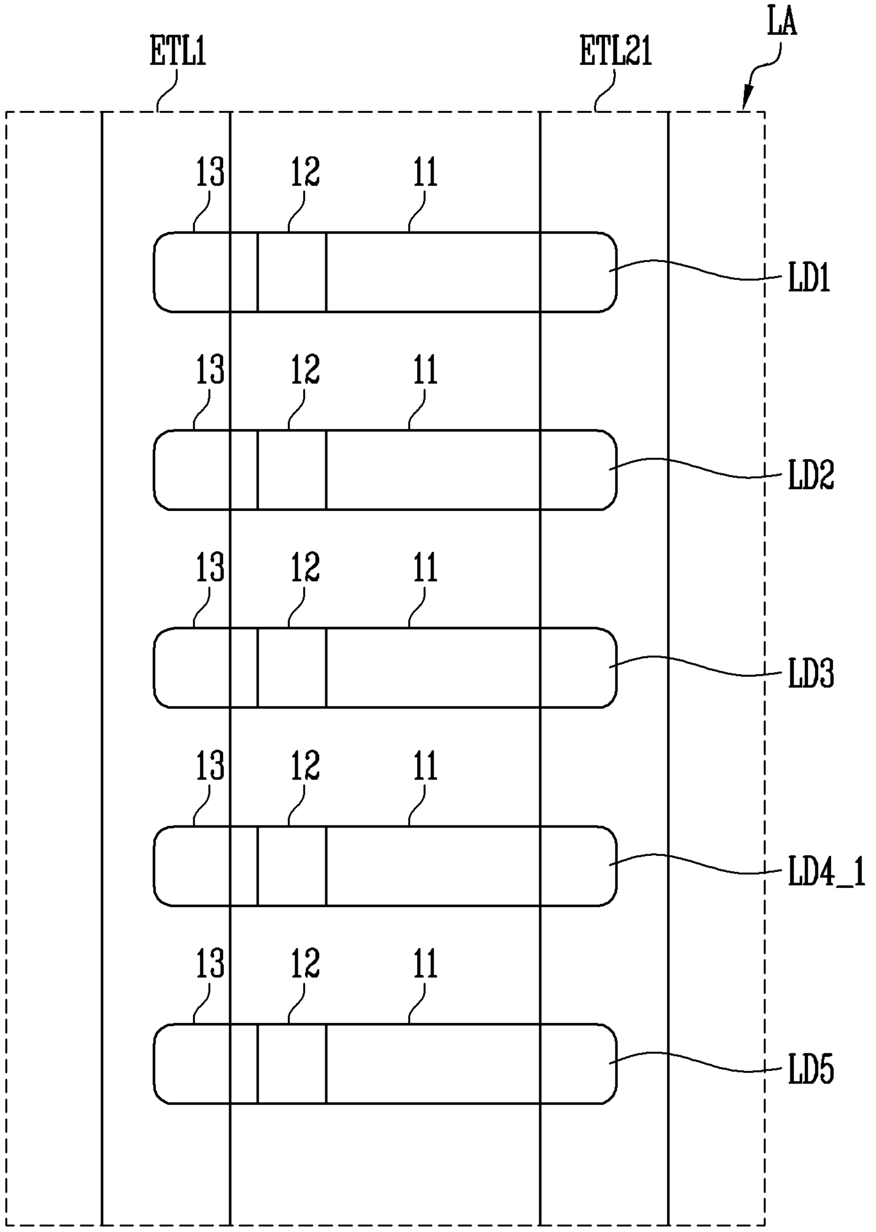
FIG. 24 is a schematic diagram illustrating the light emitting element for describing the flowchart of FIG. 16.

FIG. 16 is a flowchart illustrating a method in which an inspection device inspects and repairs a display device according to an embodiment. FIG. 17 is a schematic diagram illustrating the display panel for describing the flowchart of FIG. 16. FIG. 18 is a schematic cross-sectional view of the display panel illustrating the flowchart of FIG. 16. FIG. 19 is a schematic diagram illustrating the inspection area for describing the flowchart of FIG. 16. FIG. 20 is a schematic diagram illustrating the light emitting element for describing the flowchart of FIG. 16. FIG. 21 is an image diagram illustrating the inspection area for describing the flowchart of FIG. 16. FIG. 22 is a schematic diagram illustrating the display panel for describing the flowchart of FIG. 16. FIG. 23 is an image diagram illustrating the inspection area for describing the flowchart of FIG. 16. FIG. 24 is a schematic diagram illustrating the light emitting element for describing the flowchart of FIG. 16.

Referring to FIG. 16, according to an embodiment, the method in which the inspection device 2 inspects and repairs the display device includes a step of inputting or providing the display panel 1 to the inspection device 2 (S110), an inspection area designation step (S120), a measure position control step (S130), an electric field formation and light irradiation on panel step (S140), an image acquisition step (S150), an image analysis step (S160), an alignment degree determination step (S170), and a rearrangement step (S200).

In the descriptions, although each step is described as being performed in turn according to the flowchart, some steps shown to be performed successively may be performed simultaneously, the order of the steps may be changed or modified, some steps may be omitted, or another step may be further included between each step, unless the spirit of the disclosure is changed.

First, the step of inputting or providing the display panel 1 to the inspection device 2 (S110) may be performed. The step of inputting or providing the display panel 1 to the inspection device 2 (S110) corresponds to a step of receiving the display panel 1 in the panel loading unit 22. The control unit 21 may control the panel loading unit 22 to move the panel loading unit 22 through the position control unit 25. The panel loading unit 22 may be moved to facilitate inspection and repair while receiving the inspection device 2.

Next, the inspection area designation step (S120) may be performed. The inspection area designation step (S120) corresponds to a step of designating in advance the inspection area ISA for inspecting the alignment degree of the light emitting elements LD in the display panel 1. Referring to FIG. 14 together, at least a partial area in the display area may be set as the inspection area ISA. According to an embodiment, the inspection area ISA may be set to include at least one unit pixel. For example, the inspection area ISA may be set to include the unit pixels SSPX1, SSPX2, and SSPX3 (refer to FIG. 6) including the light emitting elements LD that emit light having the same color. Although the inspection area ISA is shown in a quadrangle shape in the drawing, the inspection area is not limited thereto, and a shape of the inspection area ISA may be varied.

Next, the measurement position control step (S130) may be performed. The measurement position control step (S130) corresponds to a step in which the measurement unit 23 is controlled to measure the set inspection area ISA. According to an embodiment, the control unit 21 may control the measurement unit 23 to move the measurement unit 23 through the position adjustment unit 25. The measurement unit 23 may be moved to be positioned on the inspection area ISA in order to perform measurement of the inspection area ISA in the display panel 1. According to an embodiment, the repair unit 24 may be moved together with the measurement unit 23.

Next, the electric field formation and light irradiation on panel step (S140) may be performed. The electric field formation and light irradiation on panel step (S140) corresponds to a step in which the control unit 21 forms the electric field in the display panel 1 through the panel loading unit 22 and the first light emitting unit 231 in the measurement unit 23 irradiates the light generated from the first light source to the inspection area ISA in the display panel 1.

Referring to FIG. 18 together, in the present step, the electric field EF may be formed in the inspection area ISA in the display panel 1. For example, the light generated from the first light source may be irradiated or emitted to the inspection area ISA in the display panel 1. In some embodiments, when the electric field EF is formed in the inspection area ISA in the display panel 1 and the light generated from the first light source is irradiated or emitted, fluidity of the light emitting element LD may increase.

According to an embodiment, the electric field formation and light irradiation on panel step (S140) may be performed in a state in which a surface of the display panel 1 is not dried. For example, the electric field formation and light irradiation on panel step (S140) may be performed in a state in which the ink is not dried, after an inkjet method is performed to form the display panel 1.

Next, the image acquisition step (S150) may be performed. The image acquisition step (S150) corresponds to a step in which the measurement unit 23 measures light (the fluorescence and the excitation light emitted by the light emitting elements LD) reflected from the inspection area ISA in the display panel 1 through the light receiving unit 233, and the control unit 21 acquires or obtain an image by imaging information on the collected reflected light (e.g., the fluorescence and the excitation light emitted by the light emitting elements LD).

Next, the image analysis step (S160) may be performed. The image analysis step (S160) corresponds to a step in which the control unit 21 analyzes the alignment degree of the light emitting elements LD in the inspection area ISA through the acquired image.

Referring to FIG. 19 together, when the light generated from the first light source is irradiated or emitted to the light emitting elements LD, each light emitting element LD may emit the fluorescence and the excitation light therein. For convenience of description, hereinafter, the term 'fluorescence' includes both of the fluorescence and the excitation light.

At this time, in the light emitting element LD, first fluorescence LT1 may be emitted from the first semiconductor layer 11, second fluorescence LT2 may be emitted from the active layer 12, and third fluorescence LT3 may be emitted from the second semiconductor layer 13. According to an embodiment, a light amount of the second fluorescence LT2 is greater than that of the first fluorescence LT1 and the third fluorescence LT3. Accordingly, in the image (refer to FIG. 18) in which the actual inspection area ISA is measured, the second fluorescence LT2 emitted from the active layer 12 may be relatively brightly observed, and the first fluorescence LT1 emitted from the first semiconductor layer 11 and the third fluorescence LT3 emitted from the second semiconductor layer 13 may be relatively darkly observed or may not be observed.

Referring to FIGS. 20 and 21 together, it may be determined whether the light emitting element LD is disposed or positioned in a forward direction or a reverse direction between the first electrode ETL1 and the second electrode ETL21 using a point in which the second fluorescence LT2 emitted from the active layer 12 is relatively brightly observed and the first length L1 of the first semiconductor layer 11 and the second length L2 of the second semiconductor layer 13 disposed with the active layer 12 interposed therebetween are different.

As an example of the drawing, the control unit 21 may determine that a first light emitting element LD1, a second light emitting element LD2, a third light emitting element LD3, and a fifth light emitting element LD5, which are some of sequentially disposed first to fifth light emitting elements LD1 to LD5, are disposed in the forward direction, and the fourth light emitting element LD4, which is a remaining portion, is disposed in the reverse direction. For example, the control unit 21 may measure the alignment degree according to a ratio of the number of light emitting elements LD disposed or positioned in the forward direction to the number of light emitting elements LD disposed or positioned in the inspection area ISA. For example, in an example of FIGS. 20 and 21, the alignment degree is 80%.

Next, the alignment degree determination step (S170) may be performed. The alignment degree determination step (S170) corresponds to a step of in which the control unit 21 determines to end the inspection when the measured alignment degree is greater than or equal to a reference value and perform the repair when the alignment degree is less than the reference value.

When the control unit 21 determines that the measured alignment degree is less than the reference value in the alignment degree determination step (S170), the rearrangement step S200 may be performed. The rearrangement step S200 is a step of repairing the display panel 1 and corresponds to a step of rearranging the light emitting elements LD, which are disposed in the reverse direction in a repair area LA, in the forward direction. Referring to FIG. 22 together, according to an embodiment, at least a portion of the repair area LA may be preset to include the inspection area ISA.

Referring to FIGS. 23 and 24 together, the second light emitting unit 241 of the repair unit 24 may irradiate or emit the light generated from the third light source to the inspection area ISA. For example, the panel loading unit 22 may form the electric field EF in the display panel 1 through the electric field formation unit 222. For example, the repair unit 24 may irradiate or emit the light generated from the third light source to the inspection area ISA in a state in which the electric field is formed in the display panel 1 by the panel loading unit 22 to rearrange the light emitting elements LD. For example, in FIG. 20, the cross-sectional view shows a state in which the fourth light emitting element LD4 of FIG. 20 is disposed in the reverse direction.

In a state in which the electric field EF is formed in the fourth light emitting element LD4 disposed in the reverse direction, when the light generated from the third light source is irradiated or emitted, the fourth light emitting element LD4 disposed in the reverse direction may be oriented in the forward direction identically or similarly to a fourth light emitting element LD4_1 of FIG. 24.

After the rearrangement step (S200) is performed, the electric field formation and light irradiation step, the image acquisition step (S150), and the image analysis step (S160) may be performed on the display panel 1 again, and the inspection and the repair may be repeated so that the alignment degree is greater than or equal to the reference value.

For example, after the inspection and the repair of the corresponding inspection area ISA is completed, the above-described steps may be performed again by setting an area different from the inspection area ISA in the display area as a new inspection area ISA. Accordingly, the inspection and the repair for the entire display area DA may be completed.

Next, an inspection device and a method of inspecting and a method of repairing a display device by using the inspection device according to another embodiment is described. Hereinafter, a description of the same components on the drawing as FIGS. 1 to 24 is omitted, and the same or similar reference numerals are used.

Figure 25:
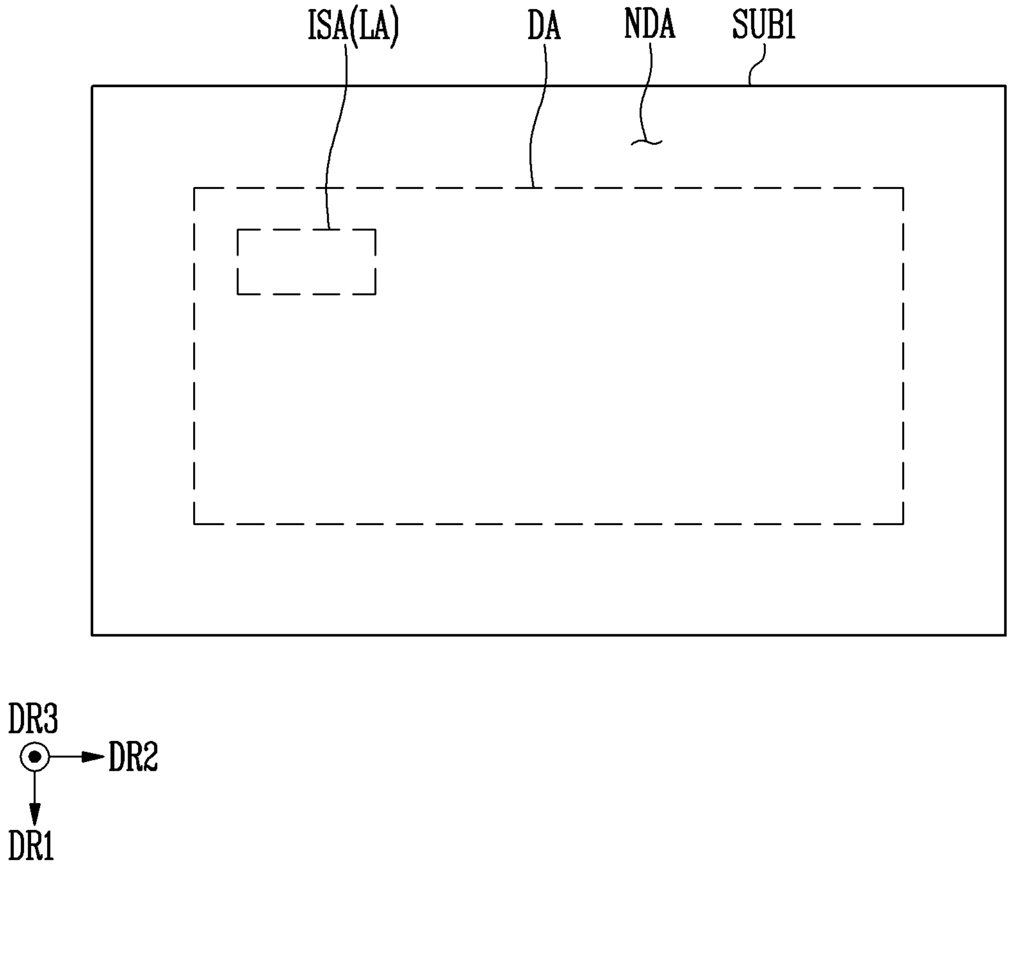
FIGS. 25 and 26 are schematic diagrams illustrating a display panel for describing a method in which an inspection device inspects and repairs a display device according to another embodiment.
Figure 26:
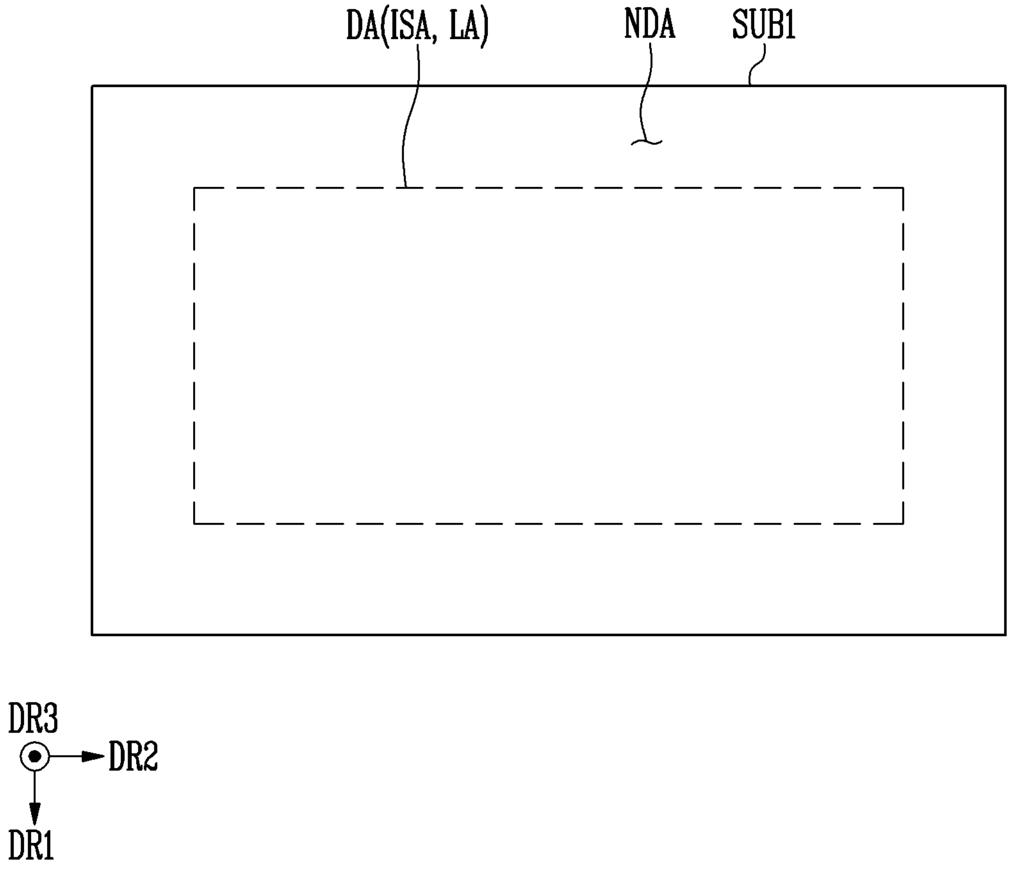

FIGS. 25 and 26 are schematic diagrams illustrating a display panel for describing the flowchart of a method in which an inspection device inspects and repairs a display device according to another embodiment. Each of embodiments of FIGS. 25 and 26 corresponds to a modified example of FIG. 22.

Referring to FIG. 25, according to an embodiment, the inspection area ISA and the repair area LA may be the same area. For example, an area in which the measurement unit 23 inspects the display panel 1 and an area in which the repair unit 24 repairs the display panel 1 may be the same.

Referring to FIG. 26, according to an embodiment, the display area DA, the inspection area ISA, and the repair area LA may be the same area. For example, the measurement unit 23 may inspect the entire display area DA in the display panel 1, and the repair unit 24 may repair the entire display area DA in the display panel 1.

Figure 27:
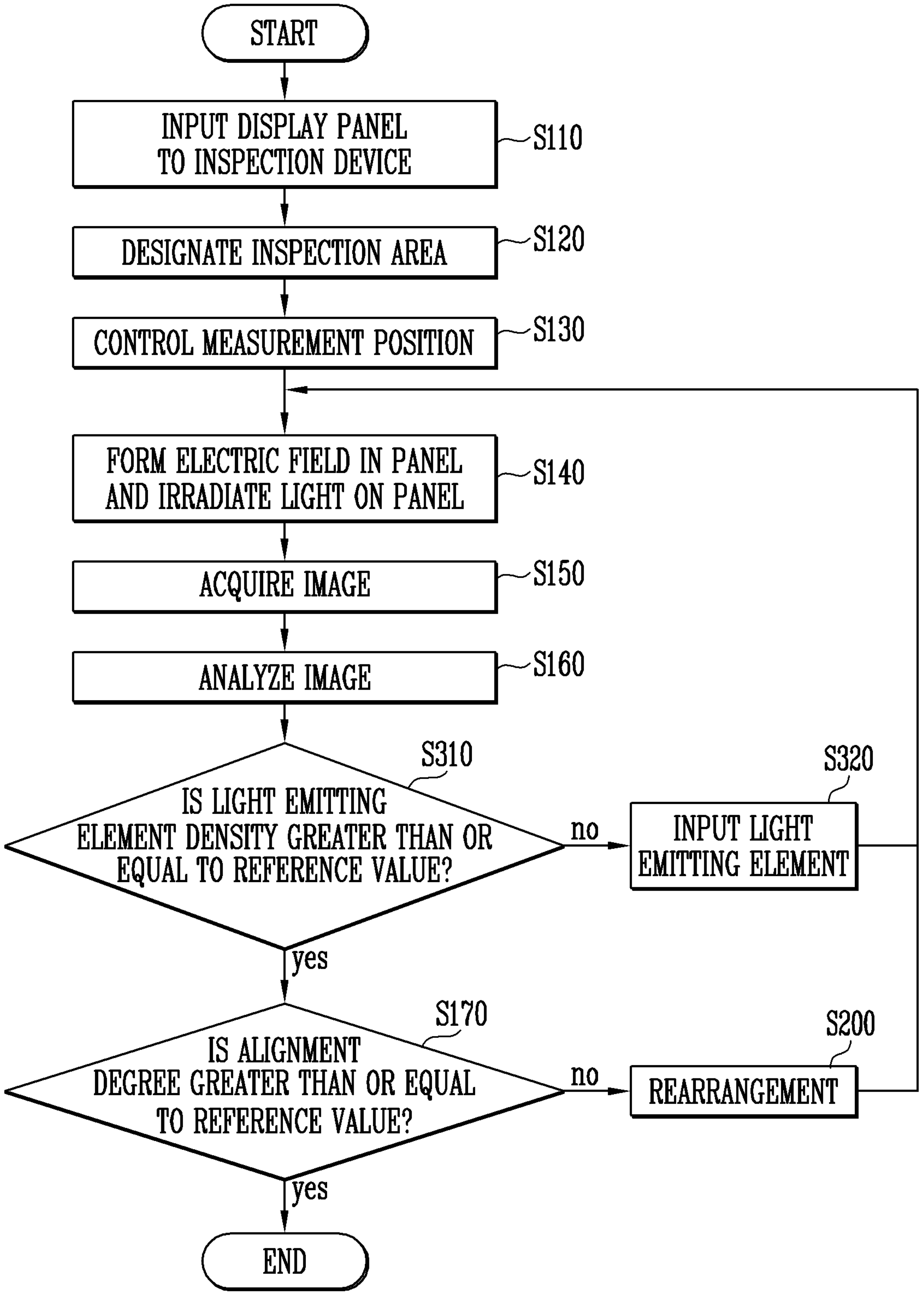
FIG. 27 is a flowchart illustrating a method in which an inspection device inspects and repairs a display device according to still another embodiment.
Figure 28:
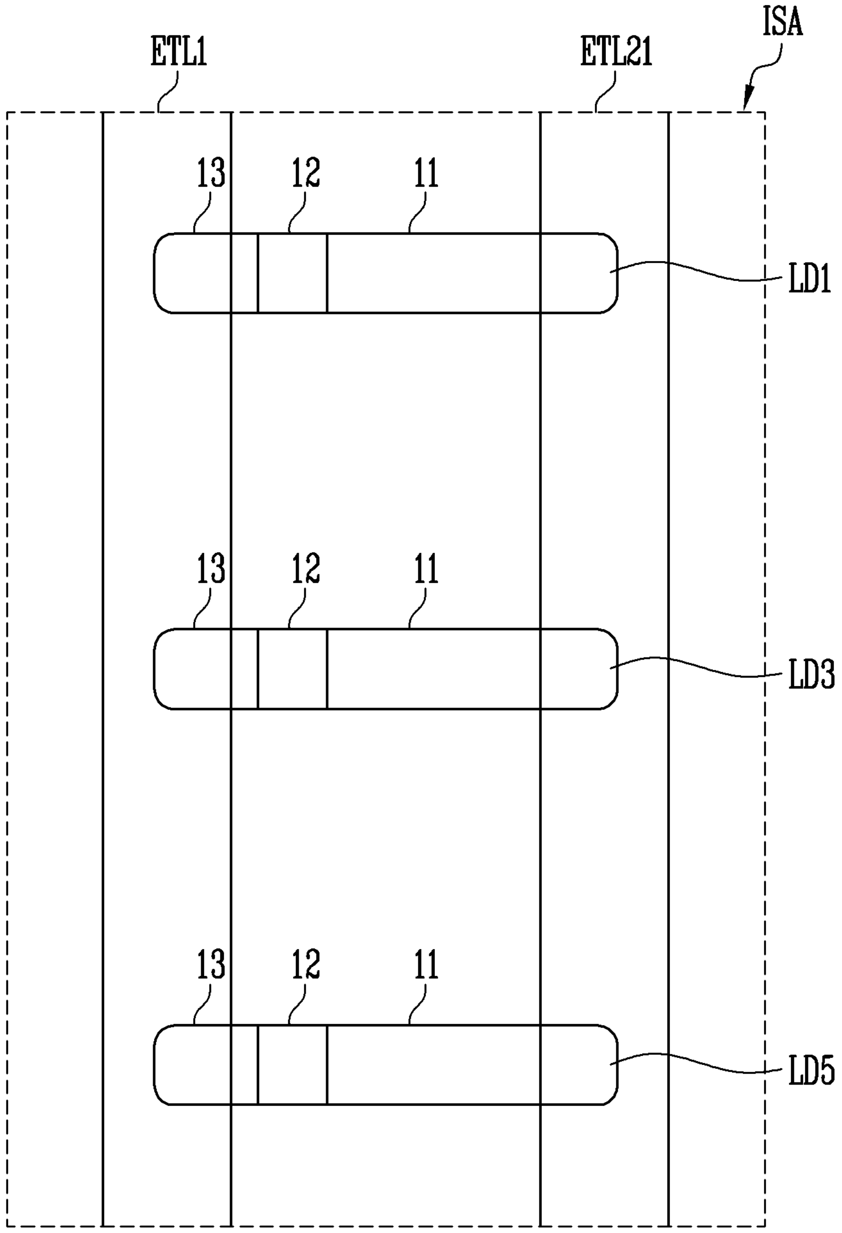
FIG. 28 is a schematic diagram illustrating the inspection area for describing the flowchart of FIG. 27.
Figure 29:
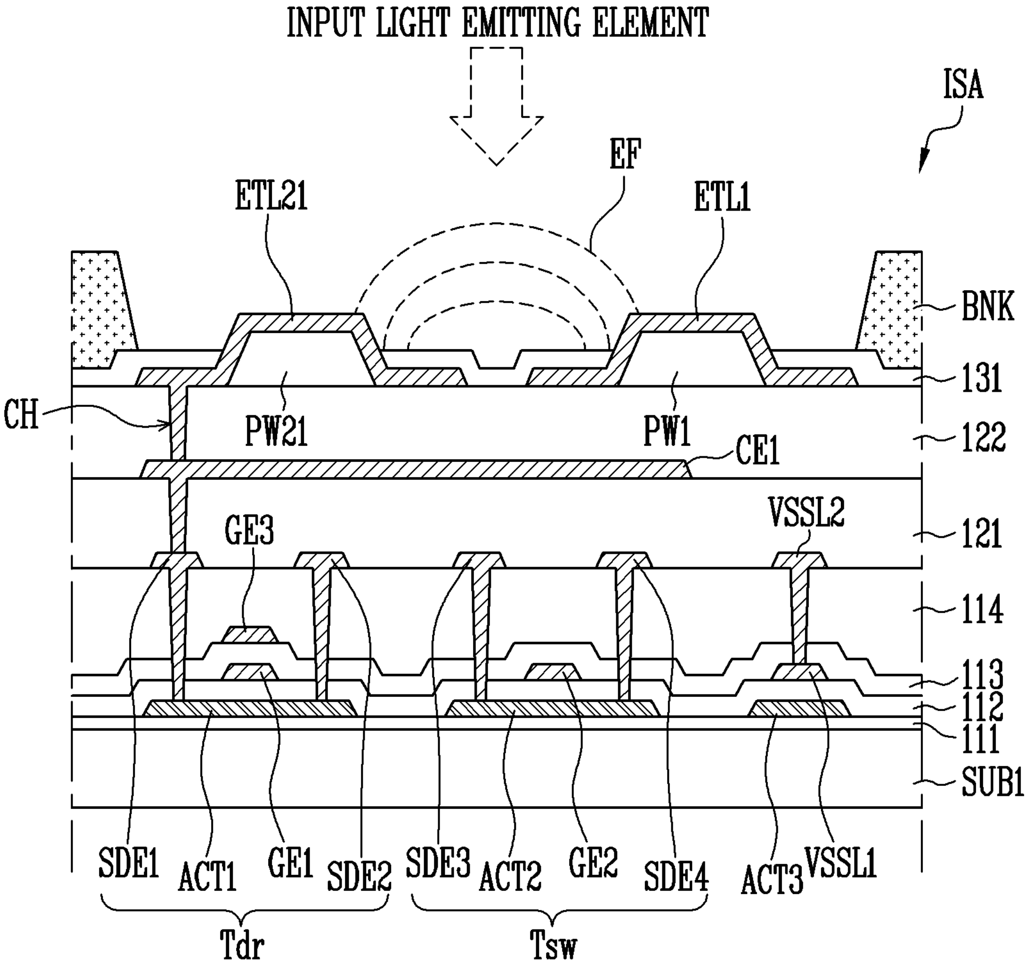
FIG. 29 is a schematic cross-sectional view of the display panel for describing the flowchart of FIG. 27.
Figure 30:
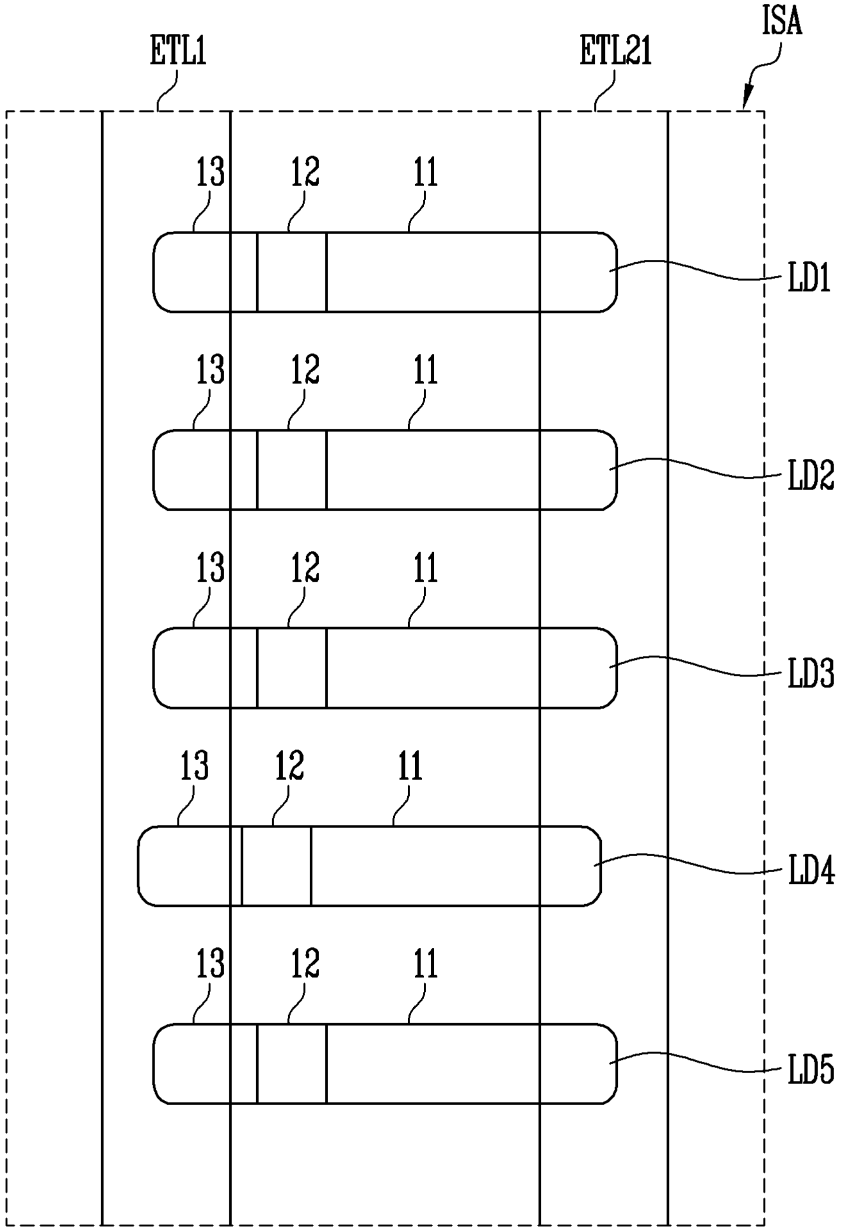
FIG. 30 is a schematic diagram illustrating the inspection area for describing the flowchart of FIG. 27.

FIG. 27 is a flowchart illustrating a method in which an inspection device inspects and repairs a display device according to still another embodiment. FIG. 28 is a schematic diagram illustrating the inspection area for describing the flowchart of FIG. 27. FIG. 29 is a schematic cross-sectional view of the display panel for describing the flowchart of FIG. 27. FIG. 30 is a schematic diagram illustrating the inspection area for describing the flowchart of FIG. 27.

Referring to FIG. 27, according to an embodiment, the method in which the inspection device 2 inspects and repairs the display device may further include a light emitting element density determination step (S310) and a light emitting element input step (S320) in addition to the step of inputting or providing the display panel 1 to the inspection device 2 (S110), the inspection area designation step (S120), the measure position control step (S130), the electric field formation and light irradiation on panel step (S140), the image acquisition step (S150), the image analysis step (S160), the alignment degree determination step (S170), and the rearrangement step (S200).

In the image analysis step (S160), the light emitting element density defined by the number of light emitting elements LD per a unit area may be further analyzed through the image obtained by the control unit 21. According to an embodiment, the unit area may be the same area as the inspection area ISA.

According to an embodiment, the light emitting element density determination step (S310) may be performed after the image analysis step (S160) and before the alignment degree determination step (S170). In the light emitting element density determination step (S310), it may be determined whether the analyzed light emitting element density is greater than or equal to a reference value.

In the light emitting element density determination step (S310), when the control unit 21 determines that the light emitting element density is greater than or equal to the reference value, the control unit 21 may determine to perform the alignment degree determination step (S170), and when the control unit 21 determines that the light emitting element density is less than the reference value, the control unit 21 may determine to perform the light emitting element input step (S320).

Referring to FIGS. 28 to 30, when the control unit 21 determines that the light emitting element density is less than the reference value as shown in FIG. 28, the control unit 21 may determine to perform the light emitting element input step (S320). In the light emitting element input step (S320), as shown in FIG. 26, the control unit 21 may form the electric field EF in the display panel 1 through the panel loading unit 22, and may input or inject the ink including the light emitting elements LD having the second concentration to the display panel 1 in an inkjet method through the inkjet facility unit 242. The light emitting element density may increase as shown in FIG. 30, by the light emitting elements LD, which is input or provided to the display panel 1.

After the light emitting element input step (S320) is performed, the electric field formation and light irradiation on panel step (S140), the image acquisition step (S150), and the image analysis step (S160) may be performed again, and the inspection and the repair may be repeated so that the light emitting element density is greater than or equal to the reference value.

Figure 31:
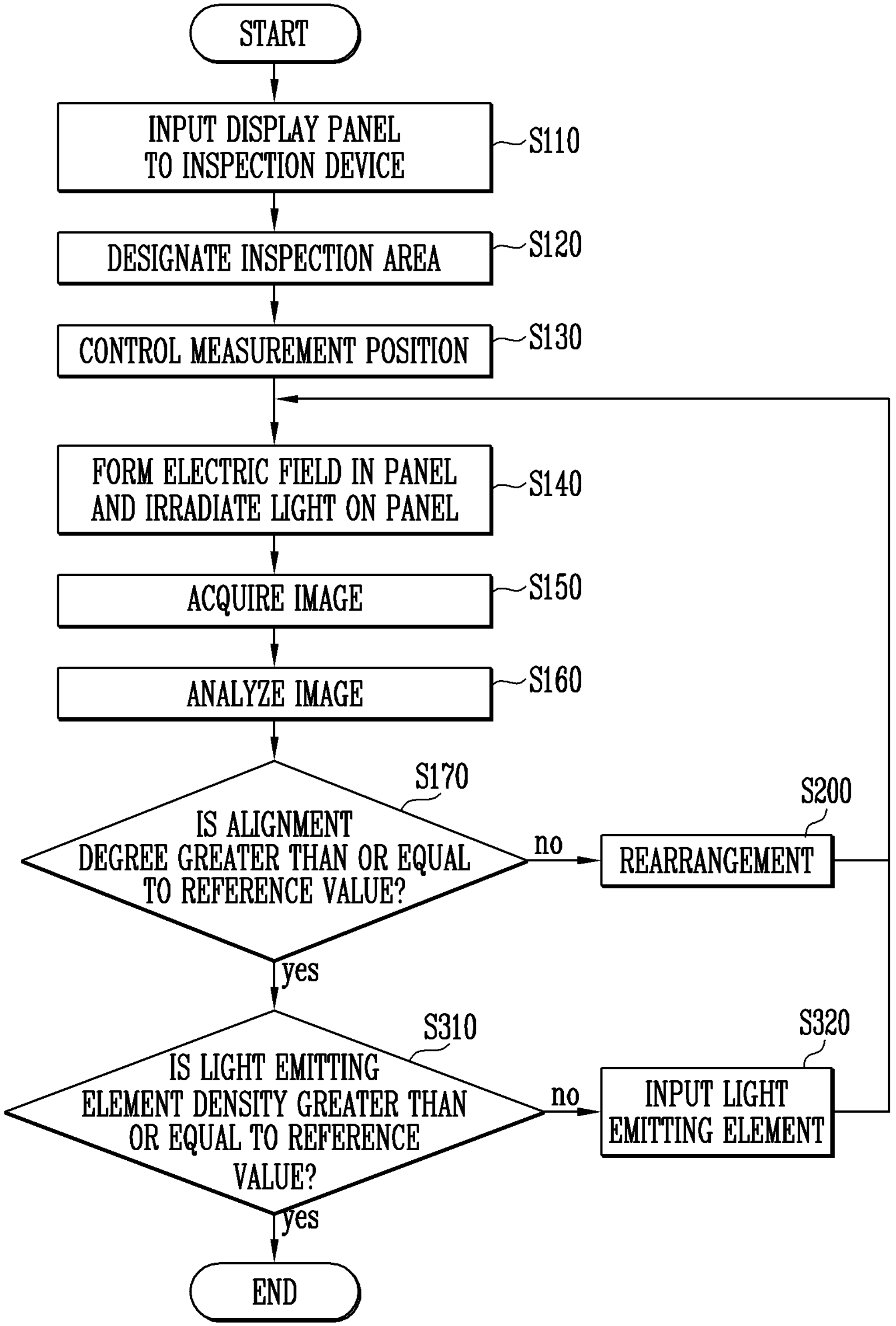
FIG. 31 is a flowchart illustrating a method in which an inspection device inspects and repairs a display device according to still another embodiment.

FIG. 31 is a flowchart illustrating a method in which an inspection device inspects and repairs a display device according to still another embodiment.

Referring to FIG. 31, the method of inspecting and repairing the display device according to an embodiment of FIG. 31 is different from the embodiment of FIG. 24, in that the light emitting element density determination step (S310) and the light emitting element input step (S320) are performed after the alignment degree determination step (S170) and the rearrangement step (S200). Since the embodiment is different from the embodiment of FIG. 27 only in a change of an order of some steps, other redundant descriptions are omitted.

Figure 32:
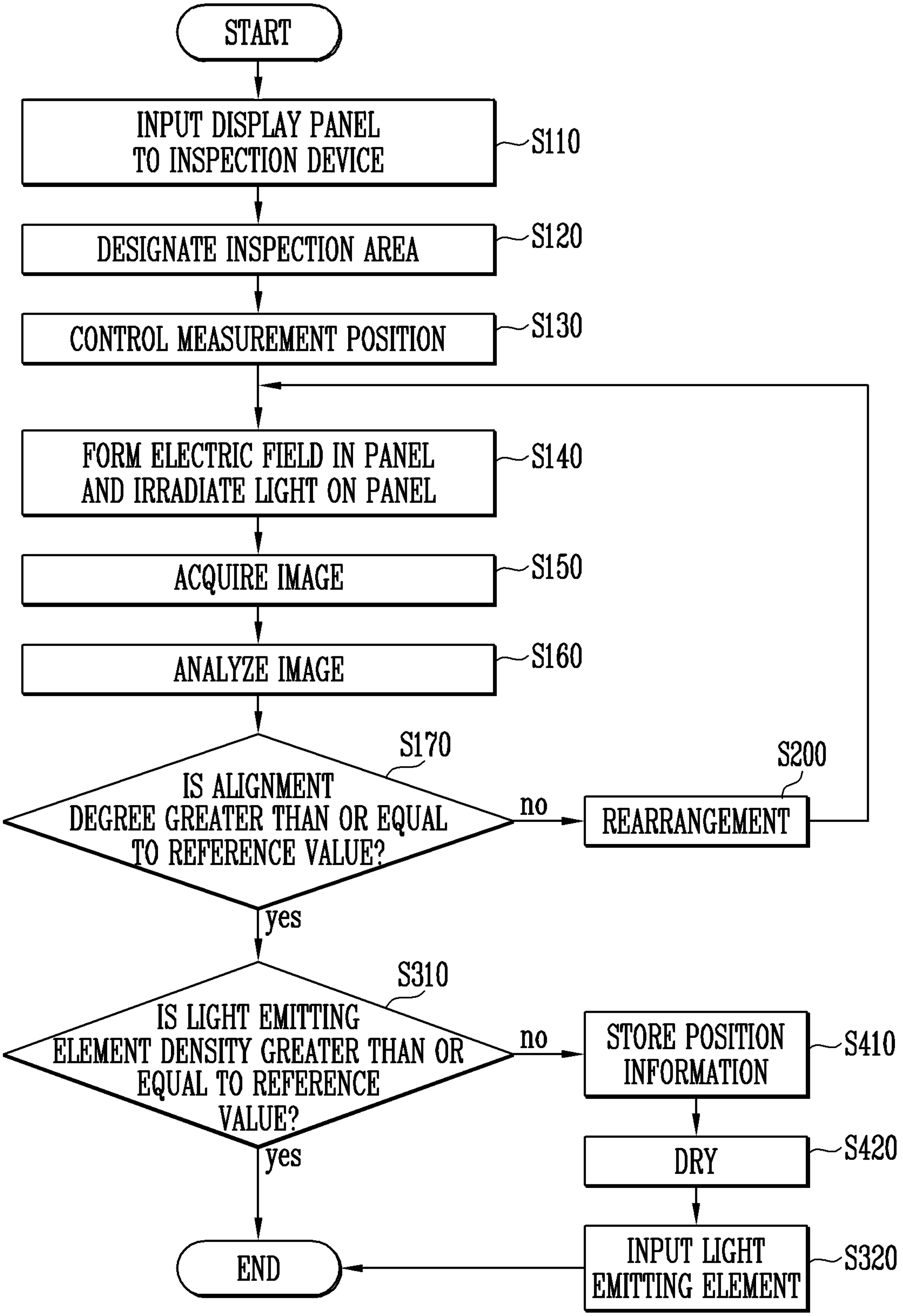
FIG. 32 is a flowchart illustrating a method in which an inspection device inspects and repairs a display device according to still another embodiment.

FIG. 32 is a flowchart illustrating a method in which an inspection device inspects and repairs a display device according to still another embodiment.

Referring to FIG. 32, the method of inspecting and repairing the display device according to an embodiment of FIG. 32 is different from the embodiment of FIG. 31, in that the method of inspecting and repairing the display device according to an embodiment further includes a position information storage step (S410) and a dry step (S420) between the light emitting element density determination step (S310) and the light emitting element input step (S320).

When it is determined that the light emitting element density in the inspection area ISA is less than the reference value in the light emitting element density determination step S310, the control unit 21 may not immediately proceed with the light emitting element LD input step, and control to perform the position information storage step (S410). The position information storage step (S410) corresponds to a step in which the control unit 21 stores position information of the corresponding inspection area ISA.

After the position information storage step (S410), the dry step (S420) may proceed. The dry step (S420) corresponds to a step of drying the ink having the first concentration, which is input or injected during the manufacturing of the display panel 1.

After the dry step (S420), the light emitting element input step (S320) may be performed. In some embodiments, the display device may perform the light emitting element input step (S320) after the inspection and the repair for the alignment degree of the entire display area DA is ended.

Figure 33:
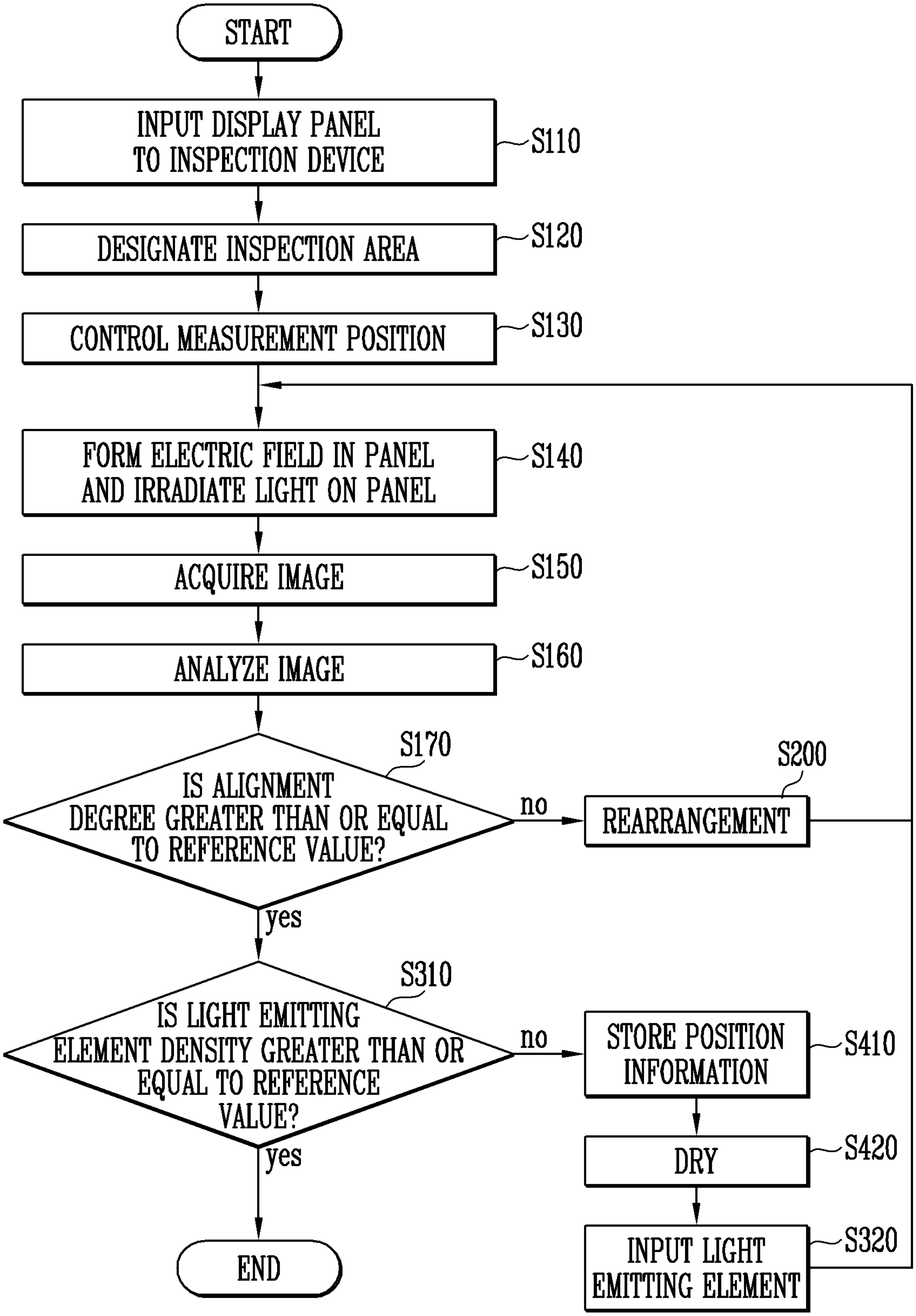
FIG. 33 is a flowchart illustrating a method in which an inspection device inspects and repairs a display device according to still another embodiment.

FIG. 33 is a flowchart illustrating a method in which an inspection device inspects and repairs a display device according to still another embodiment.

Referring to FIG. 33, the method of inspecting and repairing the display device according to an embodiment of FIG. 33 is different from the embodiment of FIG. 32, in that the electric field formation and light irradiation step, the image acquisition step (S150), and the image analysis step (S160) are performed on the display panel 1 again after the light emitting element input step (S320).

After the light emitting element input step (S320), the electric field formation and light irradiation step, the image acquisition step (S150), and the image analysis step (S160) are performed on the display panel 1 again, so that the alignment degree and the light emitting element density are greater than or equal to the reference value.

Next, a display panel manufactured according to a subsequent process after the inspection method and the repair method by the inspection device according to the above-described embodiments are performed is described.

Figure 34:
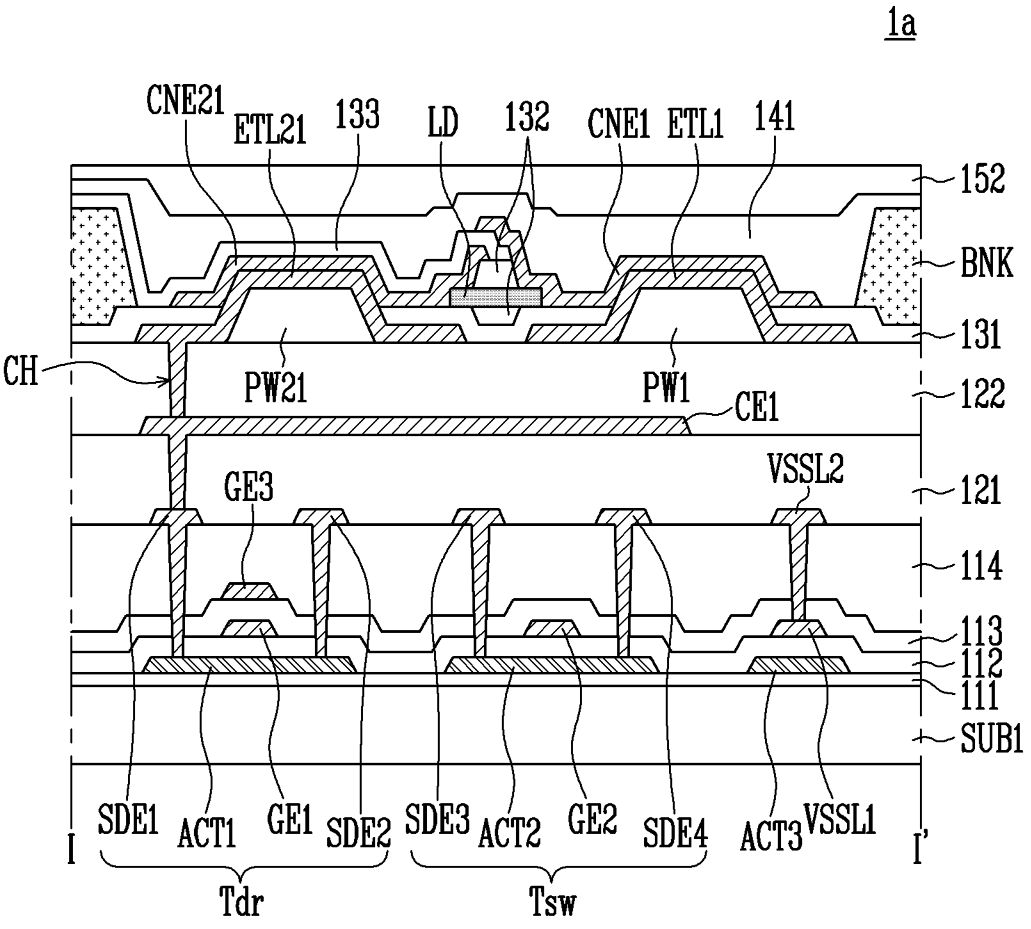
FIG. 34 is a schematic cross-sectional view of the display panel taken along line I-I' of FIG. 9.

FIG. 34 is a schematic cross-sectional view of the display panel taken along line I-I' of FIG. 9. In FIG. 34, a schematic cross-section of the shown display panel **1*a*** shows a shape formed through a subsequent process after the inspection method and the repair method by the inspection device according to the previous embodiments are performed.

Referring to FIG. 34, the display panel **1*a* on which the subsequent process is performed may further include first and second contact electrodes CNE1 and CNE21, a second insulating layer 132, a third insulating layer 133, a fourth insulating layer 141, and a thin film encapsulation layer 151 compared to the display panel 1 of FIG. 10**.

Each of the light emitting elements LD may be electrically connected between the first and second electrodes ETL1 and ETL21. For example, a first end of each of the light emitting elements LD may be electrically connected to the first electrode ETL1, and a second end of each of the light emitting elements LD may be electrically connected to the second electrode ETL21.

In an embodiment, the first end of each of the light emitting elements LD may not be directly disposed on the first electrode ETL1, and may be electrically connected to the first electrode ETL1 through at least one contact electrode, for example, the first contact electrode CNE1. However, embodiments are not limited thereto. For example, in another embodiment, the first end of the light emitting elements LD may be in direct (or indirect) contact with the first electrode ETL1 to be electrically connected to the first electrode ETL1.

For example, the second end of each of the light emitting elements LD may not be directly disposed on the second electrode ETL21, and may be electrically connected to the second electrode ETL21 through at least one contact electrode, for example, the second contact electrode CNE21. However, embodiments are not limited thereto. For example, in another embodiment, the second end of each of the light emitting elements LD may be in direct (or indirect) contact with the second electrode ETL21 to be electrically connected to the second electrode ETL21.

The second insulating layer 132 may be disposed on the light emitting elements LD (e.g., the light emitting elements LD aligned between the first and second electrodes ETL1 and ETL21) and may expose the first and second ends of the light emitting elements LD. For example, the second insulating layer 132 may not cover the first and second ends of the light emitting elements LD and may be partially disposed on only one area of the light emitting elements LD. The second insulating layer 132 may be formed in an independent pattern on each emission area, but embodiments are not limited thereto. For example, as shown in FIG. 34, when a separation space exists between the first insulating layer 131 and the light emitting elements LD before formation of the second insulating layer 132, the space may be filled by the second insulating layer 132. Accordingly, the light emitting elements LD may be more stably supported.

The third insulating layer 133 may be formed to cover a portion of one of the first contact electrode CNE1 and the second contact electrode CNE21. According to an embodiment, the first contact electrode CNE1 and the second contact electrode CNE21 may be formed on different layers, respectively. For example, the third insulating layer 133 may be disposed to cover the second contact electrode CNE21, and the first contact electrode CNE1 may be disposed on the third insulating layer 133. However, embodiments are not limited thereto, and the third insulating layer 133 may be disposed to cover the first contact electrode CNE1, and the second contact electrode CNE21 may be disposed on the third insulating layer 133. In another embodiment, the third insulating layer 133 may be omitted, and the first contact electrode CNE1 and the second contact electrode CNE21 may be formed on the same layer.

The fourth insulating layer 141 may be formed and/or disposed on one surface of the base layer SUB1 on which the first and second partition walls PW1 and PW21, the first and second electrodes ETL1 and ETL21, the light emitting elements LD, the first and second contact electrodes CNE1 and CNE21, and the bank BNK so as to cover the first and second partition walls PW1 and PW21, the first and second electrodes ETL1 and ETL21, the light emitting elements LD, the first and second contact electrodes CNE1 and CNE21, and the bank BNK.

The thin film encapsulation layer 152 including at least one inorganic layer and/or organic layer may be included on the fourth insulating layer 141. According to an embodiment, at least one overcoat layer may be further disposed on the fourth insulating layer 141.

Although the embodiments have been described with reference to the accompanying drawings, those skilled in the art will understand that the embodiments may be implemented in other specific forms without changing the technical spirit and essential features of the invention. Therefore, it should be understood that the embodiments described above are illustrative and are not restrictive in all aspects.

The invention claimed is:

1. A method of inspecting a display panel including light emitting elements, the method comprising:

acquiring an image of the display panel; and determining an alignment degree of the light emitting elements in an inspection area of the display panel according to a ratio of a number of ones of the light emitting elements aligned in a forward direction in the inspection area to a total number of the light emitting elements in the inspection area.

2. The method according to claim 1, further comprising:

forming an electric field in the display panel; and irradiating light generated from a first light source included in a first light emitter to the inspection area of the display panel.

3. The method according to claim 2, wherein the light emitting elements are provided to the display panel by an inkjet method of injecting ink including the light emitting elements having a first concentration, and wherein the forming of the electric field and the irradiating of the light are performed in a state in which the ink injected on the display panel is not dried.

4. The method according to claim 2, wherein the light generated from the first light source is ultraviolet ray.

5. The method according to claim 4, wherein the first light emitter includes the first light source and a second light source configured to generate infrared ray.

6. The method according to claim 2, wherein the acquiring of the image of the display panel is performed after the forming of the electric field and the irradiating of the light.

7. The method according to claim 6, wherein the acquiring of the image is performed by collecting fluorescence and excitation light emitted by the light emitting elements, and imaging information on the collected fluorescence and excitation light.

* * * * *